United States Patent [19]
Takeuchi et al.

[11] Patent Number: 5,539,279
[45] Date of Patent: Jul. 23, 1996

[54] FERROELECTRIC MEMORY

[75] Inventors: Kan Takeuchi, Kodaira; Masashi Horiguchi, Kawasaki; Masakazu Aoki, Tokorozawa; Katsumi Matsuno, Kokubunji; Takeshi Sakata, Kunitachi; Jun Etoh, Hachioji; Yoshinobu Nakagome, Hamura, all of Japan

[73] Assignee: Hitachi, Ltd., Tokyo, Japan

[21] Appl. No.: 362,239

[22] Filed: Dec. 22, 1994

Related U.S. Application Data

[63] Continuation-in-part of Ser. No. 257,542, Jun. 9, 1994, Pat. No. 5,455,786.

[30] Foreign Application Priority Data

Jun. 23, 1993 [JP] Japan .................................. 5-151917
Dec. 22, 1993 [JP] Japan .................................. 5-324825

[51] Int. Cl.$^6$ .................................................. G11C 11/22
[52] U.S. Cl. ........................... 365/145; 365/149; 365/203
[58] Field of Search ................................ 365/145, 149, 365/203

[56] References Cited

U.S. PATENT DOCUMENTS 4,873,664 10/1989 Eaton, Jr. .................................. 365/145
4,974,204 11/1990 Miller ........................................ 365/145
5,010,518 4/1991 Toda .......................................... 365/145
5,297,077 3/1994 Imai et al. ................................ 365/145

*Primary Examiner*—A. Zarabian
*Assistant Examiner*—Son Dinh
*Attorney, Agent, or Firm*—Antonelli, Terry, Stout & Kraus

[57] ABSTRACT

A highly reliable and high speed ferroelectric memory having a high degree of integration. In a ferroelectric memory having a multiple of memory cells M1, each constituted by one transistor and one ferroelectric capacitor, in the normal operation, the ferroelectric memory is used as a volatile memory in which a voltage on a storage node ST1 stores information in a DRAM mode. Both the electric potential at the plate PL1 of the ferroelectric capacitor and a precharge electric potential on a data line DL1(j) are Vcc/2. When the a power supply voltage is turned on, a polarization state is detected as a ferroelectric memory of a plate electric potential of Vcc/2 and a precharge electric potential of Vss (or Vcc) and the read operation is performed a FERAM mode. The switching between the DRAM mode and the FERAM mode is executed by generating a signal to designate the FERAM mode in the memory along with the turn-on of the power supply and by generating a signal to designate the DRAM mode after completion of the conversion operation from nonvolatile information to volatile information.

30 Claims, 19 Drawing Sheets

FERROELECTRIC MEMORY

CROSS-REFERENCE TO RELATED APPLICATION

This is a continuation-in-part of U.S. Ser. No. 08/257,542 filed Jun. 9, 1994, now U.S. Pat. No. 5,455,786, entitled by "Ferroelectric Memory" being filed by Kan Takeuchi, Katsumi Matsuno, Yoshinobu Nakagome, and Masakazu Aoki.

BACKGROUND OF THE INVENTION

The present invention relates, in general, to a nonvolatile semiconductor memory employing a ferroelectric material and, more particularly, to a ferroelectric memory which is capable of holding the newest information as the nonvolatile information and of realizing the high integration, the high reliability, and the high speed operation and of being handled in the same manner as a dynamic random access memory (DRAM).

A ferroelectric random access memory (hereinafter, referred to as "an FERAM" for short, when applicable) employing a ferroelectric material is a nonvolatile memory which operates to store the information therein on the basis of the polarization state of ferroelectric materials. However, in prior art ferroelectric memories, the polarization is switched in the operation of reading out the information as well as in the operation of writing the information, causing fatigue in a film made of a ferroelectric material. As a result, there arises a problem that the permitted number of accesses with respect to the rewrite and read of the information is remarkably limited as compared with dynamic random access memories (DRAMs) for example. In addition, there arises another problem that since the fixed period of time is required for the switch of the polarization, the operation time is necessarily delayed.

As for the method of solving the problems of the fatigue of the ferroelectric film and the reduction of the read speed which occur along with the switch of the polarization, the following method is proposed in JP-A-3-283176. That is, as shown in an array configuration of FIG. 2, in the normal operation, the electric potential on a plate line is made Vcc for example so that the FERAM is used as the DRAM, and before the power supply has been turned off, on the basis of the write operation by the FERAM, the information of interest is stored in the form of nonvolatile information. If the electric potential on the plate line is made Vcc, in the case where the electric potential at the storage node is either 0 V or Vcc, the polarization is not inverted at all. Therefore, the problem of the fatigue of the ferroelectric capacitor can be effectively prevented and also the reduction of the read speed does not occur. Next, when turning the power supply on, if the nonvolatile information is read out on the basis of the read operation by the FERAM, the FERAM can be substantially operated as a nonvolatile memory.

However, in the above-mentioned memory with both DRAM and FERAM modes, there arises still another problem that operation of converting the volatile information into the nonvolatile information is complicated. That is, it is necessary that with respect to all the memory cells, after the information is first read out on the basis of the operation by DRAMs, in correspondence to that information thus read out, that information is stored in the form of nonvolatile information on the basis of the FERAM operation. In particular, in the case where the power source assumes the off state due to unexpected trouble, it is very difficult to speedily complete the above-mentioned conversion operation. For the period of time when in the above-mentioned system, a ferroelectric memory is used as the DRAM, all the polarization of the ferroelectric material is arranged in one direction. Therefore, all the stored information is erased along with the unexpected off state of the power supply.

SUMMARY OF THE INVENTION

The present invention was made in order to overcome the above-mentioned problems associated with the prior art ferroelectric memory, and it is therefore an object of the present invention to provide a highly reliable and high speed nonvolatile memory (a ferroelectric memory) having a high degree of integration which, while constituted by one transistor and one capacitor in the same way as that in the DRAM, is capable of mitigating the fatigue of a ferroelectric capacitor due to the polarization switch and of holding the newest information in the form of nonvolatile information even in the case where the power supply is forced to be turned off due to the unexpected trouble.

Another object of the invention is to provide a nonvolatile memory by a handling method and a pin arrangement which are similar to those of the DRAM. That is, according to the conventional memory with both DRAM and ferroelectric memory as mentioned above, the memory is operated as a ferroelectric memory at the time of turn-on of the power supply, the read/write operation is executed as a DRAM at a certain time point, and the memory needs to be again returned to the ferroelectric memory at the end of the operation. It is, therefore, necessary for the user of the memory to use the memory while being aware of the change-over of the modes of the DRAM and ferroelectric memory. As a pin arrangement, moreover, surplus F/D pins or the like to execute the above mode switching are necessary. Thus, there arises a problem such that the system is hard to be built and handled due to the changeover operation of the modes and the pin arrangement different from that of the DRAM. It will be obviously understood that it is desirable for the user to have a non-volatile memory with a handling method and pin arrangement similar to those of the DRAM without being aware of the internal complicated mode switching.

To accomplish each of the above objects, in a semiconductor memory having a plurality of memory cells each constituted by at least one transistor and one ferroelectric capacitor, the ferroelectric memory according to the present invention has means (constituted by a precharge circuit, a circuit for detecting a power supply voltage, a circuit for supplying a plate electric potential, and the like) for performing, as a volatile memory, say, a DRAM, the read and write operations in a normal state and for making speedily a plate electric potential the ground electric potential (0 V) in an off state of a power supply. The plate electric potential is set to Vcc/2 and a data line precharge electric potential in the read operation is also set to Vcc/2. On the other hand, only when the power supply is turned on, the operations for detecting the polarization state of the ferroelectric capacitor and for converting the information as the polarization state to the information as the potential of a capacitor node are executed. That is, the memory is operated as a conversion mode (ferroelectric memory mode: FERAM mode) from the nonvolatile information to the volatile information. The switching between the DRAM mode and the ferroelectric memory mode is executed by a ferroelectric memory/ DRAM switching signal which is produced in the memory. Namely, when the power supply is turned on, such a switching is detected and the above switching signal is set to a level indicative of the FERAM mode, for example, the low level. On the other hand, when the conversion operation from the nonvolatile information to the volatile information is finished with respect to all of the memory cells, the completion of the conversion operation is detected and the switching signal is set to a level indicative of the DRAM mode, namely, the high level.

In other words, according to the invention, the F/D pins are unnecessary as in the DRAM as for the pin arrangement and the memory is set to the FERAM mode with the turn-on of the power supply. If the read and write operations are executed in the FERAM mode, the polarization is switched in the operations. However, in the invention, the memory is automatically converted to the DRAM mode by the control of the internal circuit for switching the mode. In the DRAM mode, the polarization is not switched in the read operation and the polarization is switched in the write operation. Even if the power supply is cut out during the use of the memory in the DRAM mode, the nonvolatile information is held in correspondence to the polarization state of the capacitor film made of the ferroelectric material at that time point.

Further, according to another semiconductor memory of the invention, a configuration is possibly designed in such a way that the plate is common to only the memory cells connected to the common word line (the configuration having a plurality of plate lines) in order to further improve the reliability of the ferroelectric memory, or alternatively the above-mentioned means is included in SRAMs.

Incidentally, the present ferroelectric memory is suitable for a system in which the number of read operations is larger than the number of rewrite operations, e.g., a system which is applied to the storage of the data and the program itself in the case where the calculation is carried out forward on the basis of the program.

According to the invention, the following effects are obtained. Namely, since the memory is ordinarily operated as a DRAM mode in which both the plate electric potential and the precharge electric potential on the data line are set to Vcc/2, the polarization is not switched when the information is read out. Thus, the problems such as fatigue of the ferroelectric film and reduction of the read speed don't occur. On the other hand, when the information is rewritten, both the volatile information as the electric potential of a capacitor node and the nonvolatile information as a polarization state of the ferroelectric film are always rewritten in correspondence to each other. Thus, the user of the memory can hold the information at the time of the turn-off of the power supply in the memory without being aware of the switching between the FERAM mode and the DRAM mode. There is provided means which operates to drop speedily the plate electric potential from Vcc/2 down to 0 V before the electric potential at the storage node (capacitor node) is dropped from Vcc down to 0 V, whereby the polarization state is more stably held, and it is possible to leave the newest nonvolatile information which has been obtained by the most recent rewrite operation. When the power supply is turned on, on the other hand, the memory is first activated as an FERAM mode by a signal generated in the memory and the conversion from the nonvolatile information to the volatile information is automatically executed. After completion of the conversion operation, the memory is set into the DRAM mode by a signal generated in the memory. Therefore, the user doesn't need to be aware of the switching between FERAM and DRAM modes even at the time of turn-on of the power supply. That is, according to the invention, the nonvolatile memory in which the number of information read operations and the information read speed are almost similar to those of the DRAM can be obtained by a handling method and a pin arrangement which are similar to those of the DRAM. In other words, according to the invention, the nonvolatile memory in which the integration degree is high, the reliability is high, the operating speed is high, and the handling method is simple and familiar toy the user can be provided. In the DRAM mode, although the rewrite operation is accompanied by the polarization switch, the limit of the number of rewrite operations is estimated to be equal to or larger than $10^{11}$ times which is larger by far than $10^6$ times, i.e., the limit which is considered in the electrically erasable and programmable read only memory (the EEPROM) for example. Therefore, the ferroelectric memory according to the present invention can be applied to many systems without any problem. For example, the ferroelectric memory according to the present invention can be applied to the operation of storing the data and the program itself, and the like, in the case where the calculation, in which in general, the number of read operations is larger than the number of rewrite operations, is carried out forward on the basis of the program.

DESCRIPTION OF THE PREFERRED EMBODIMENTS

The preferred embodiments of the present invention will hereinafter be described in detail with reference to the accompanying drawings.

First Embodiment

Figure 1:
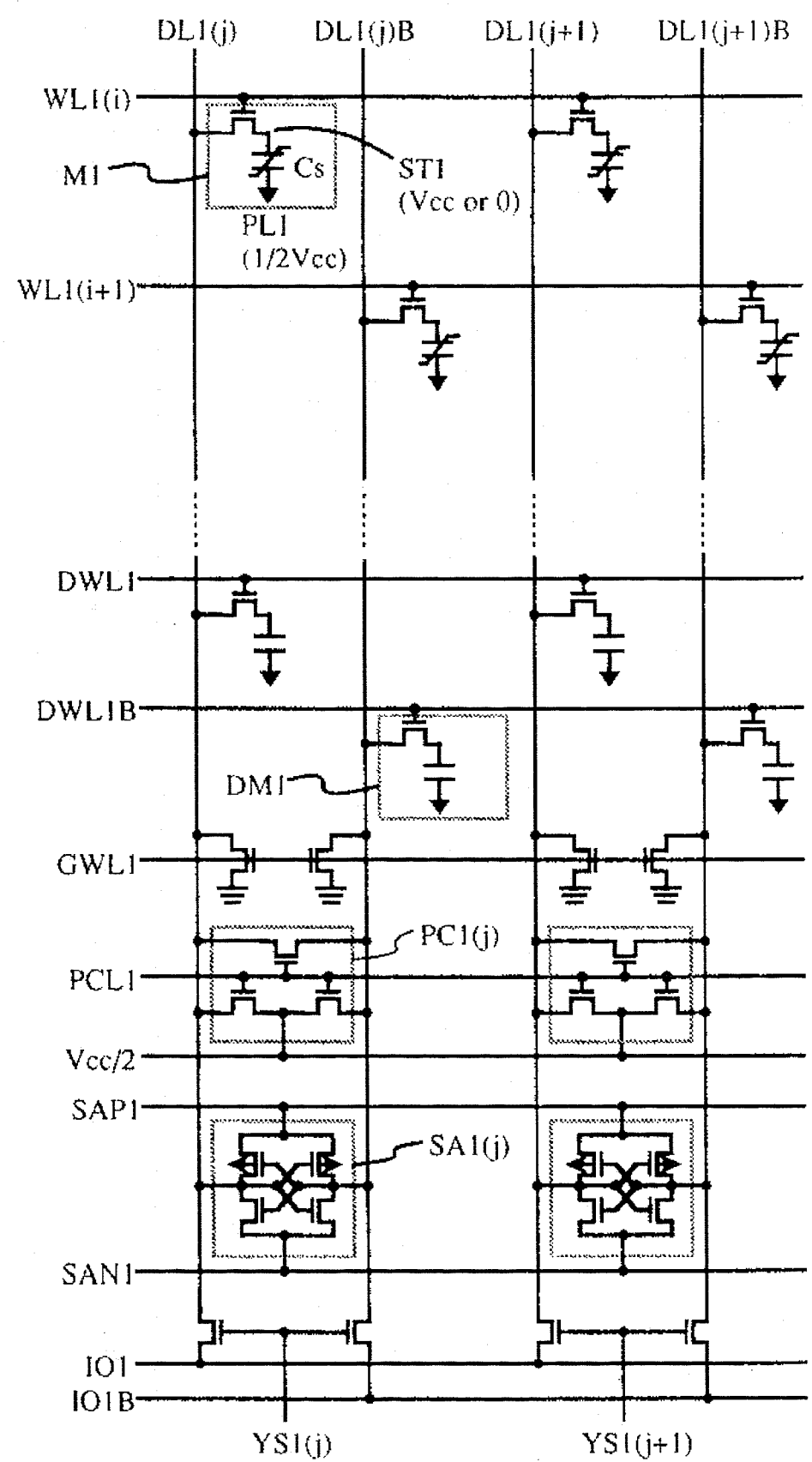
FIG. 1 is a diagram showing an array configuration of a ferroelectric memory in an embodiment of the present invention.
Figure 2:
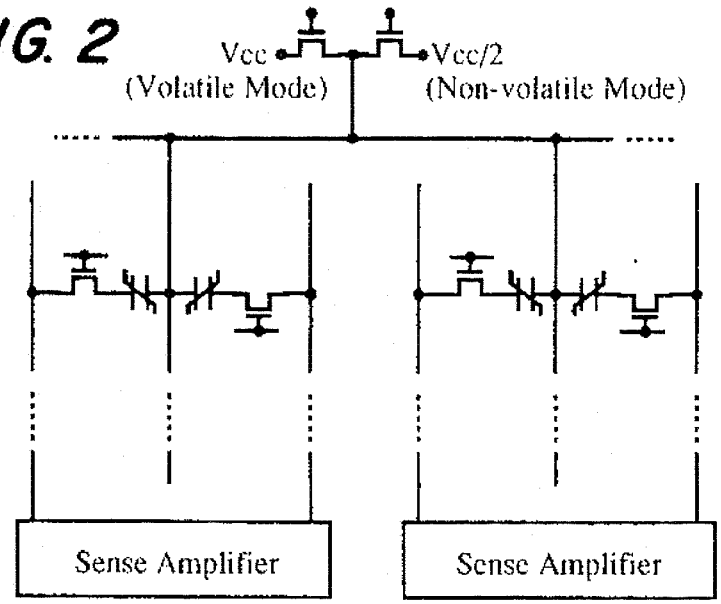
FIG. 2 is a diagram showing an array configuration of a conventional ferroelectric memory.

FIG. 1 is a circuit diagram showing an array configuration of a ferroelectric memory in the first embodiment of the present invention.

A memory cell M1 of the present embodiment is constructed by one transistor and one ferroelectric capacitor. The electric potential at a plate PL1 of the ferroelectric capacitor is always fixedly set to Vcc/2. On the other hand, in a storage node ST1 of the ferroelectric capacitor, the volatile information Vcc or 0 V is held. The electric potentials on a pair of data lines DL1(j) and DL1(j)B are continued to be held at Vcc/2 by a precharge circuit PC1(j) until the time just before the read or rewrite operation is performed. A sense amplifier SA1(j) which operates to detect and amplify the stored information is connected to the pair of data lines. The present memory cell array has a plurality of dummy cells DM1 each of which, when the power source is turned on, operates to read out the polarization state of a film made of a ferroelectric material and to convert the nonvolatile information into the volatile information. In addition, a signal line GWL1 and each transistor connected to the signal line GWL1 are used to precharge the associated pair of data lines to 0 V when performing the operation of reading out the nonvolatile information.

Figure 3:
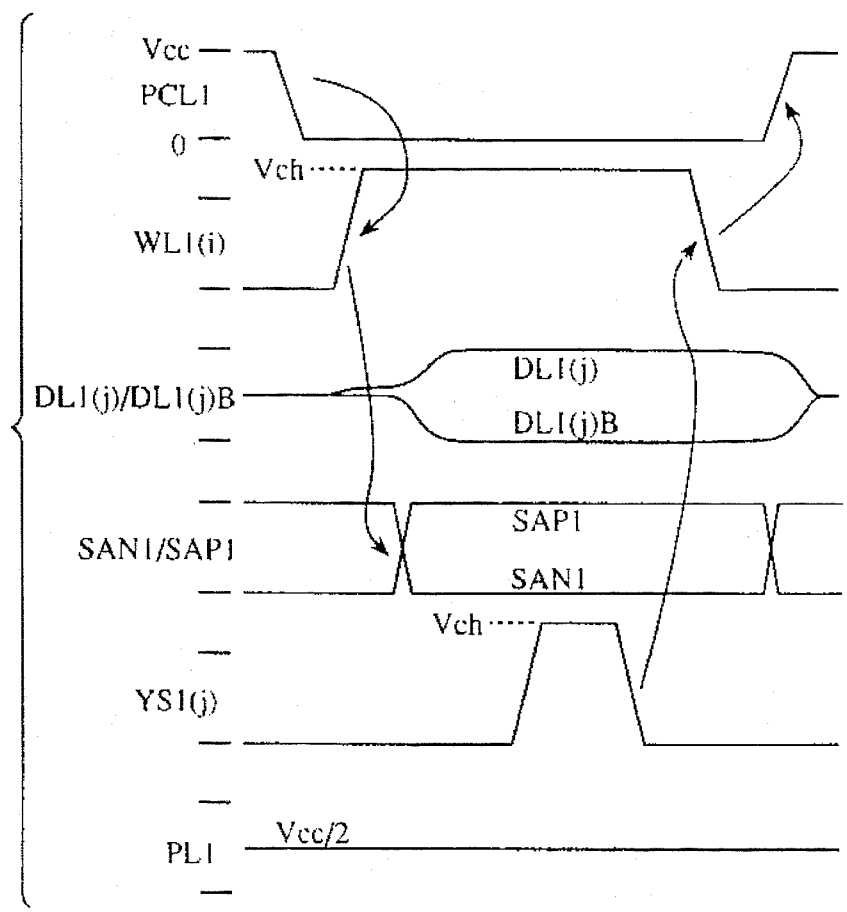
FIG. 3 is a timing chart showing the operation of reading out the stored information in a memory cell array in FIG. 1.

FIG. 3 is a timing chart showing the operation of reading out the stored information in the memory cell array shown in FIG. 1.

In the present embodiment, in order to detect the stored voltage of the storage node ST1, firstly, the electric potential on a precharge control line PCL1 is decreased from Vcc down to 0 V. As a result, the associated data line becomes the floating state in which the electric potential thereon is Vcc/2. Next, the electric potential on a word line WL1(i) is increased from 0 V to up to Vch. In this connection, the electric potential Vch is higher than the electric potential Vcc by at least the threshold voltage of the transistor. As a result, in the case where the electric potential at the storage node was Vcc, the electric potential on the data line DL1(j) becomes slightly higher than that on the data line DL1(j)B, i.e., Vcc/2. On the other hand, in the case where the electric potential at the storage node was 0 V, the electric potential on the data line DL1(j) becomes slightly lower than that on the data line DL1(j)B. The electric potential difference therebetween is detected and amplified by the sense amplifier SA1(j), whereby the electric potential on the data line DL1(j) coincides with the electric potential at the storage node, i.e., becomes Vcc or 0 V. In addition, the data line DL1(j)B becomes opposite in the electric potential to the data line DL1(j). Incidentally, in order to operate the sense amplifier, the electric potential on a control line SAM1 for the p-channel MOS transistors of the sense amplifier, and the electric potential on a control line SAN1 for the n-channel MOS transistors of the sense amplifier may be set to Vcc and 0 V, respectively. On the basis of the above-mentioned operations, the information of all the memory cells which are connected to the selected word line WL1(i) is respectively read out to the associated data lines to which the memory cells are respectively connected. In order to selectively read out the information stored in one memory cell to the outside through a pair of IO lines, the electric potential on a line YS1(j) for selecting the sense amplifier may be increased from 0 V up to Vch, and also the desired pair of data lines may be connected to the pair of IO lines. In order to complete the read operation, if the electric potential on the selection line YS1(j) is returned from Vch down to 0 V and then the electric potential on the word line WL1(i) is returned to 0 V, the storage node ST1 is electrically separated from the associated data line with the information rewritten thereto. If the electric potential on the precharge control line PCL1 is returned to Vcc and also the electric potential on the control lines SAP1 and SAN1 are returned and 0 V to Vcc, respectively, the state before the read operation is provided, and thus the operation is completed.

As described above, according to the present embodiment, the polarization state, which was stored in the ferroelectric film in correspondence to the electric potential at the storage node before the read operation, is not switched during the read operation because during the read operation, the electric field for switching the polarization is not applied to the ferroelectric capacitor. Therefore, it is possible to prevent the fatigue of the ferroelectric film which occurs along with the read operation. In addition, it is also possible to prevent the reduction of the read speed due to the time required for the polarization switch. Further, the stored information is always held in the form of the nonvolatile information corresponding to the polarization state of the ferroelectric film as well as the volatile information stored at the storage node. Therefore, even if the power supply is turned off at any time, the information is not erased at all. In such a way, according to the present embodiment, it is possible to obtain a high reliability and high speed nonvolatile memory having a high degree of integration.

Figure 4:
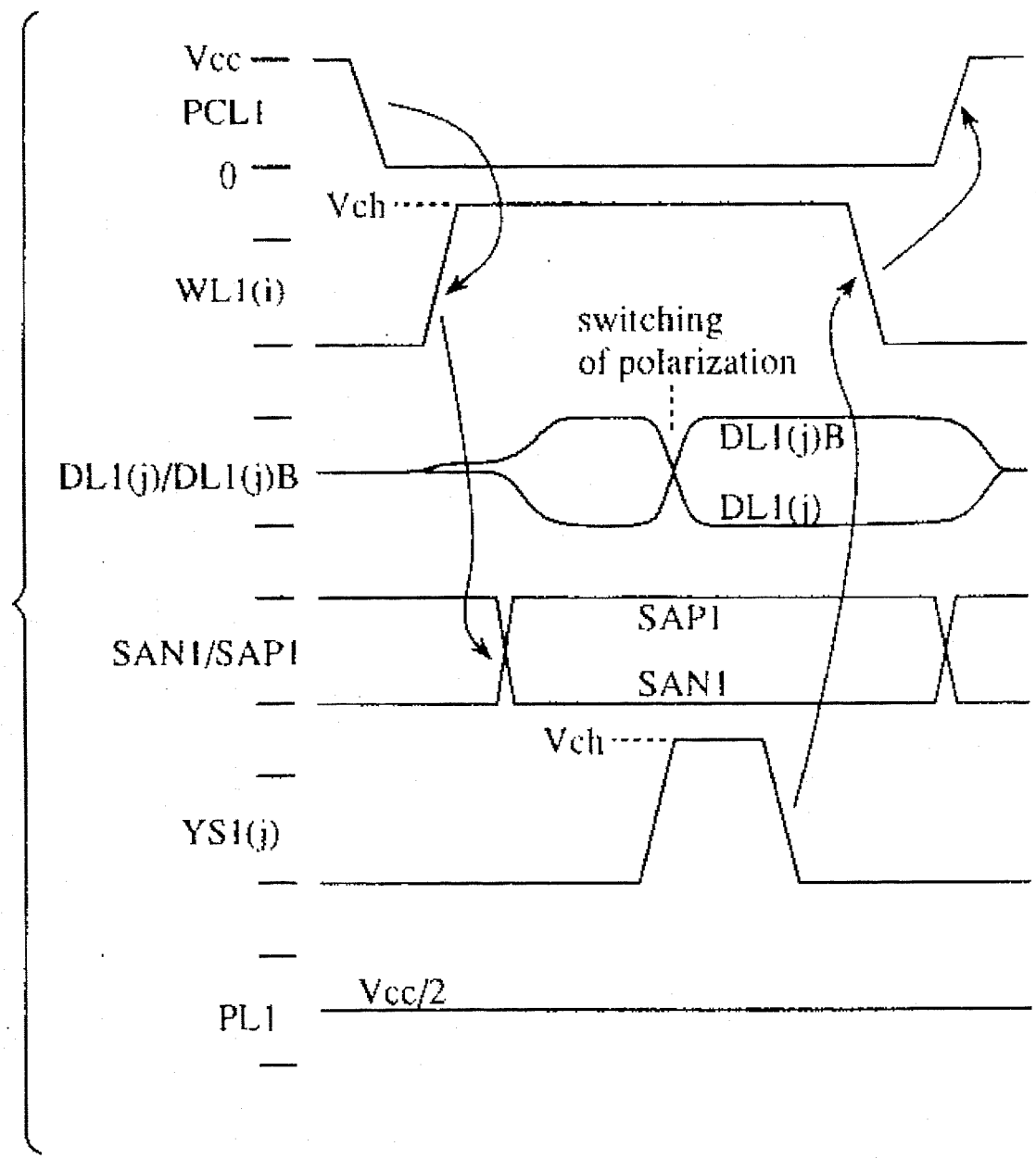
FIG. 4 is a timing chart showing the operation of rewriting the information in the memory cell array in FIG. 1.

FIG. 4 is a timing chart showing the operation of rewriting the information in the memory cell array shown in FIG. 1.

In the operation of rewriting the information in the present embodiment, the polarization switching of the ferroelectric film is performed together with the inversion of the electric potential at the storage node ST1. In the rewrite operation shown in FIG. 4, the operation starting from decreasing the electric potential on the signal line PCL1 from Vcc down to 0 V to actuating the sense amplifier is the same as the read operation which was already described with reference to FIG. 3. Next, in order to write the information to be rewritten which has been prepared on the pair of IO lines to the desired memory cell, the electric potential on the signal line YS1(j) is increased from 0 V up to Vch. As a result, the electric potentials on the pair of data lines DL1(j) and DL1(j)B are inverted. Since the word line WL1(i) is in the activation state, the electric potential at the storage node and the polarization state of the ferroelectric film in the desired memory cell are inverted and switched along with the inversion of the electric potential on the pair of data lines. After the information has been rewritten in such a way, the rewrite operation is completed in the same procedure as that in FIG. 3. According to this embodiment of the present invention, the volatile information and the nonvolatile information are rewritten with always coinciding with each other. Therefore, there is provided the effect that a high reliable nonvolatile memory can be obtained in which even if the power source is turned off at any time, the information is not erased at all. Incidentally, in order to readily invert the electric potential latched in the sense amplifier by the activation of the signal line YS1(j), a procedure may be adopted such that after the word line WL1(i) was temporarily deactivated to decrease the load on the pair of data lines, the electric potentials on the pair of data lines are inverted, and then that word line is again activated to invert the information stored in the associated memory cell.

Figure 5:
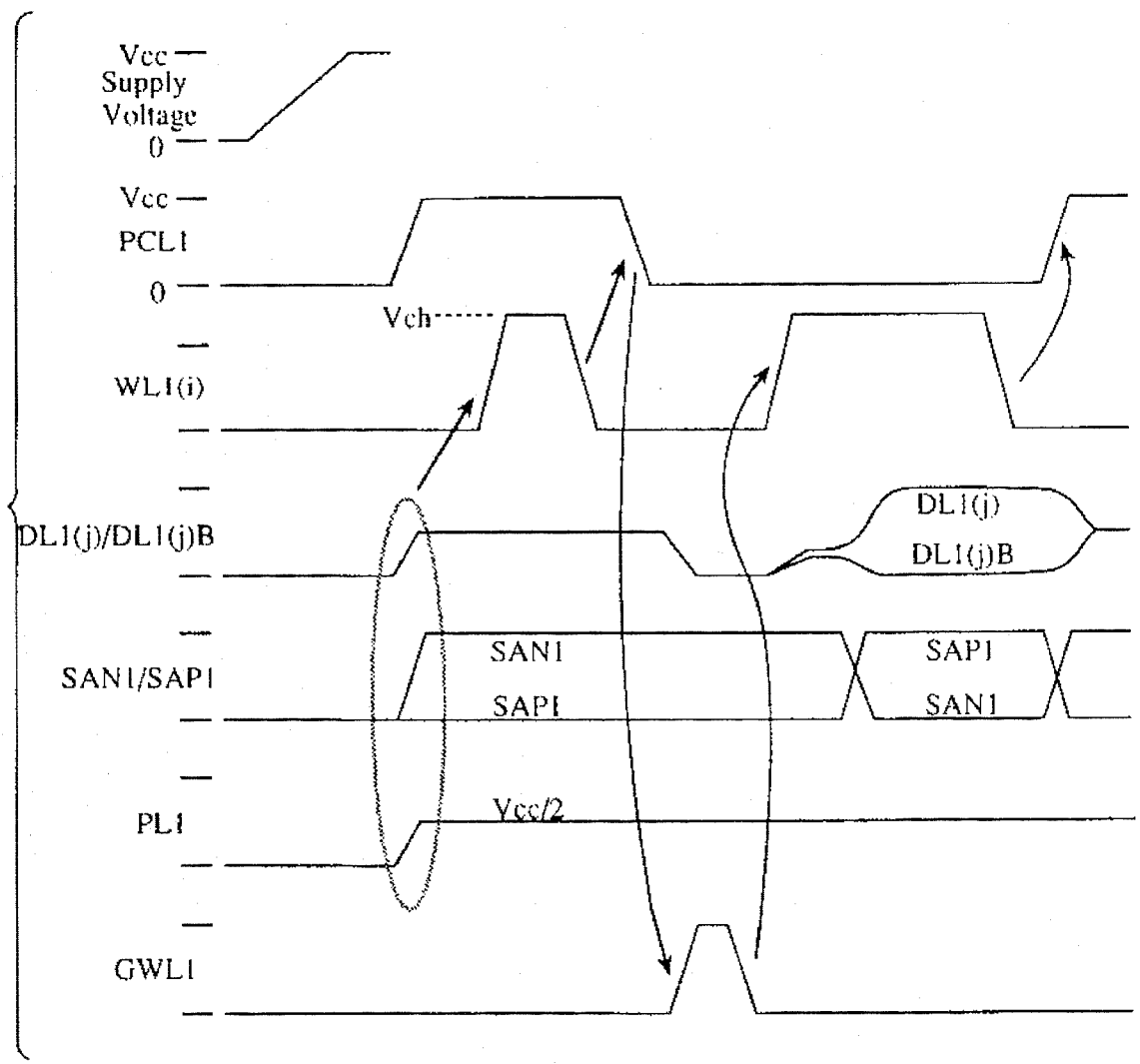
FIG. 5 is a timing chart showing the operation of converting from the nonvolatile information to the volatile information at the time of turn-on of a power supply in the memory cell array in FIG. 1.

FIG. 5 is a timing chart showing the operation of converting the nonvolatile information into the volatile information, which is performed when the power supply is turned on, in the memory cell array shown in FIG. 1.

In the present embodiment, before turning the power supply on, all the electric potentials are 0 V. Along with the activation of the power supply, the electric potential at the plate PL1 is initialized to Vcc/2, and the electric potentials on the signal lines SAP1 and SAN1 of the sense amplifier are initialized to 0 V and Vcc, respectively. In addition, the electric potential on the signal line PCL1 is raised from 0 V up to Vcc, and as a result, the electric potentials on the pair of data lines DL1(j) and DL1(j)B are precharged to Vcc/2. During this time, the electric potential on the word line is held at 0 V and the storage node ST1 is made in the floating state so that when boosting the electric potential at the plate, the polarization state of the ferroelectric film is not destroyed at all. At this time point, although the electric potential at the storage node ST1 is boosted from 0 V up to a level near about Vcc/2 through the ferroelectric capacitor, in order to further stabilize the polarization information, the following operation may be performed. That is, when the electric potential at the plate PL1 and the electric potentials on the pair of data lines LD1(j) and DL1(j)B are surely stabilized at Vcc/2, the word lines WL1(i) (i=1, 2, . . . , n) are activated one by one, and the electric potential at the storage node ST1 is surely made Vcc/2 which electric potential is the same as that at the plate PL1. From the above-mentioned initialization operation on, the operation proceeds to the operation of converting the nonvolatile information into the volatile information. First, the electric potential on the signal line PCL1 is made 0 V and also the associated pair of data lines are made in the floating state with all the word lines held at 0 V. Next, the signal line GWL1 is activated, and the pair of data lines are precharged to 0 V to be made in the floating state again. Thereafter, if the word lines WL1(i) are activated, the current is caused to flow from the storage node ST1 into the associated data line, and as a result, the electric potential on the associated data line is increased. The degree of increase of that electric potential depends on the polarization state of the ferroelectric film. That is, since after the electric potential on the associated data line has been increased, the plate is still maintained at a higher electric potential, the polarization state is arranged in one direction. The effective capacitance of the ferroelectric capacitor in the case where the above-mentioned activation of the word lines are accompanied by the switching of the polarization is larger than that in the case where the above-mentioned activation of word lines are not accompanied by the switching of the polarization. As a result, the degree of increase of the electric potential on the associated data line becomes large. On the basis of the degree of increase of the electric potential on the associated data line, the initial polarization state of the ferroelectric film can be known. More specifically, the procedure may be adopted such that the dummy cell DM1 is provided which operates to generate an intermediate signal on the complementary data line DL1(j)B. The intermediate signal is between the electric potential generated on the associated data line corresponding to the two polarization states. The electric potential difference between the pair of data lines DL1(j) and DL1(j)B is detected and amplified by the sense amplifier SA1(j). The capacitor of the dummy cell is, for example, a paraelectric capacitor with a suitable capacitance which operates to generate the desired degree of increase of the electric potential. The electric potential on the associated data line is charged to Vcc or 0 V by the operation of the sense amplifier, and as a result, the volatile information is written to the storage node ST1. Finally, after the word line has been deactivated, the electric potential on the associated data line is returned to Vcc/2 and a series of operations are completed. If the above-mentioned operations are performed with respect to the word lines WL1(i) (i=1, 2, . . . , n), the operation of converting the nonvolatile information into the volatile information will be completed.

As described above, according to the present embodiment, since the switching of the polarization of the ferroelectric film which occurs along with the operation of reading out the information can be limited to only the time of turning the power supply on, it is possible to prevent the fatigue of the ferroelectric film as much as possible. In addition, in the normal operating state, it is also possible to prevent the reduction of the read speed due to the time required for the polarization switch. Further, the information at the time point when turning the power supply off is stored, and therefore, when turning the power supply on the next time, that information can be recovered. Thus, according to the present embodiment, it is possible to obtain a highly reliable and high speed nonvolatile memory.

Figure 6:
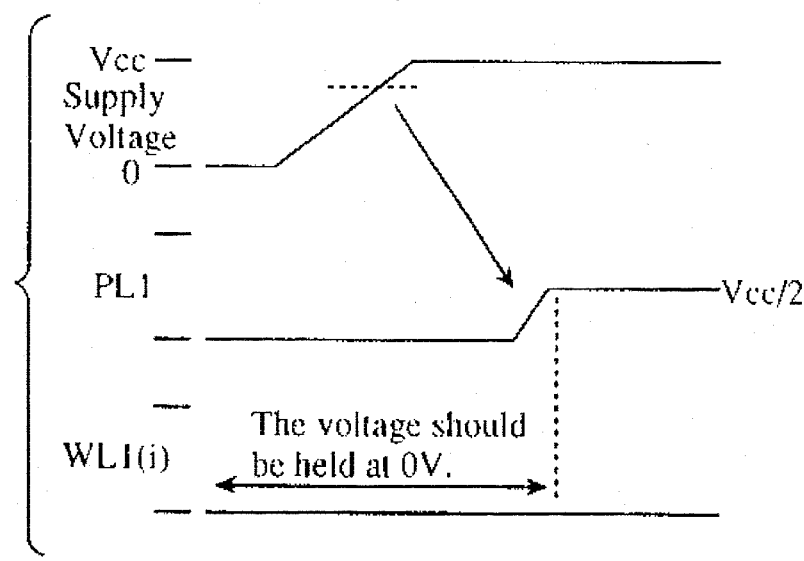
FIG. 6 is a timing chart showing the fundamental initial operation to be first executed at the time of turn-on of the power supply in a ferroelectric memory array in FIG. 1.

FIG. 6 is a timing chart showing the initial operation, which is first to be performed when turning the power supply on, in the ferroelectric memory array shown in FIG. 1.

In the present embodiment, it is detected that by turning the power supply on, the power supply voltage is increased up to a level equal to or higher than the fixed level. If this fact is confirmed, the voltage of the plate PL1 is increased up to Vcc/2, and then the operation proceeds, for example, to the work of converting the nonvolatile information into the volatile information which has been described with reference to FIG. 5. On the other hand, for at least a period of time ranging from the time when turning the power supply on up to the time when the supply of the plate electric potential is completed, the electric potential on the word line is held at 0 V. Thus, according to the present embodiment, since when boosting the plate voltage, the storage node is necessarily in the floating state, the electric field across the ferroelectric capacitor remains so small that the polarization state is retained. As a result, the nonvolatile stored information which was held in the ferroelectric memory before turning the power supply on is not destroyed by the operation which is performed along with the actuation of the power supply. Thus, according to the present embodiment, it is possible to obtain a highly reliable nonvolatile memory.

Figure 7:
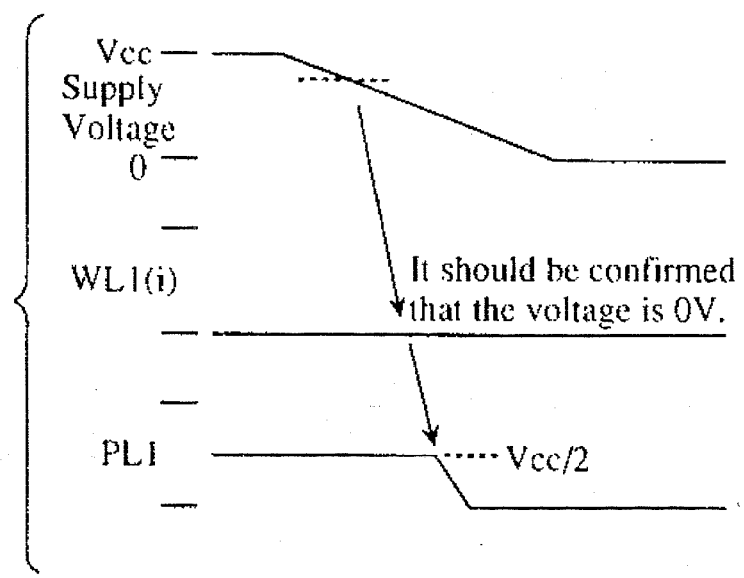
FIG. 7 is a timing chart showing the fundamental finishing operation to be executed at the time of turn-off of the power supply in the ferroelectric memory array in FIG. 1.

FIG. 7 is a timing chart showing the basic ending operation, which is to be performed in the off state of the power supply, in the ferroelectric memory array shown in FIG. 1.

In the present embodiment, when the power supply is forced to be turned off due to intentional operation or unexpected trouble, a circuit for detecting power supply voltage is actuated which operates to detect that the power supply voltage is reduced down to a level equal to or lower than the fixed level, and then the ending operation is started. First, the electric potentials on all the word lines WL1(i) are made 0 V. Next, the voltage of the plate PL1 is discharged speedily from Vcc/2 down to 0 V.

According to the present embodiment, since when the electric potential at the storage node is Vcc for example, the plate electric potential can be made 0 V before the electric potential at the storage node is slowly discharged down to 0 V by the junction leakage current and the like, the electric field for switching the polarization is not applied to the ferroelectric capacitor. Therefore, even if the power supply is forced to be turned off due to intentional operation or unexpected trouble, the nonvolatile stored information is not destroyed at all. Thus, according to the present embodiment, a highly reliable nonvolatile memory can be obtained on the basis of the simple ending operation. Incidentally, it is, of course, to be understood that there is obtained the effect that even if there is noise of a sort by which the power supply voltage is dropped for the fixed period of time and then is recovered again, the operation shown in FIG. 7 functions effectively, and thus a highly reliable ferroelectric memory can be obtained.

A method whereby the user of the semiconductor memory of the invention automatically executes the fundamental operation in the memory according to the on/off operations of the power supply voltage shown in the embodiment of the invention in FIGS. 1 and 3 to 7 without being aware of it will now be described with respect to the following embodiments.

Figure 8:
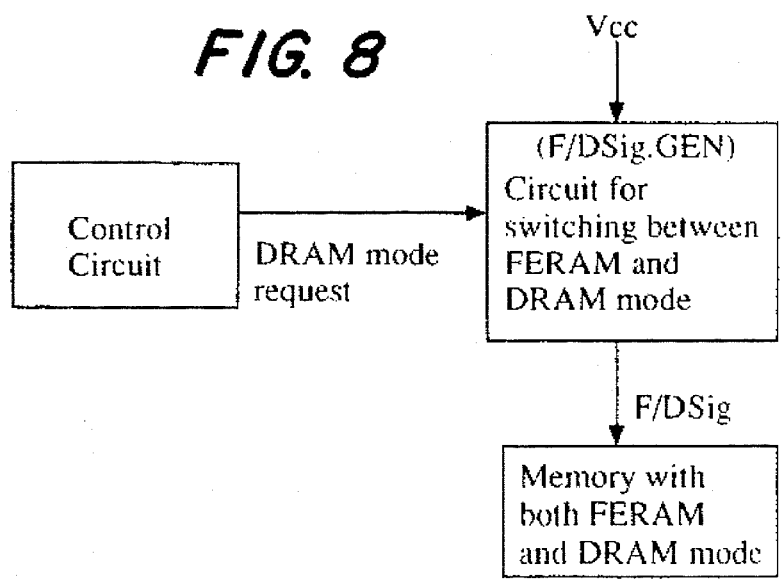
FIG. 8 is a connection diagram of a circuit for generating a switching signal between the FERAM mode and the DRAM mode showing an embodiment of the invention.

FIG. 8 is a diagram showing an embodiment of a method of generating a switching signal for switching between the FERAM mode and the DRAM mode in the invention.

As shown in FIG. 8, when the power supply is turned on, a circuit F/D Sig.GEN for generating the switching signal between the FERAM mode and the DRAM mode makes the memory operative as the FERAM mode by, for example, setting a mode switching signal F/D Sig to the low level.

In this case, the memory cells of the memory with both of the FERAM and DRAM modes are sequentially accessed and the conversion for converting from the nonvolatile information stored as a polarization state of the ferroelectric capacitor film into the volatile information as a capacitor node electric potential, namely, the recall operation is executed. After completion of the recall operation, the mode switching signal F/D Sig is set to, for example, the high level, thereby making the memory operative in a DRAM mode. The conversion into the DRAM mode is performed by a signal which is generated in the internal control circuit in correspondence to the end of the recall operation. According to the embodiment, there is an effect such that the nonvolatile memory can be obtained by a handling similar to the DRAM without making the user of the present memory be aware of the switching between the FERAM mode and the DRAM mode. Moreover, since the present memory is ordinarily used as a DRAM, there are effects such that the ferroelectric film and the information read speed are not deteriorated in the read-out operation and the high speed nonvolatile memory with the high reliability can be obtained.

Figure 9:
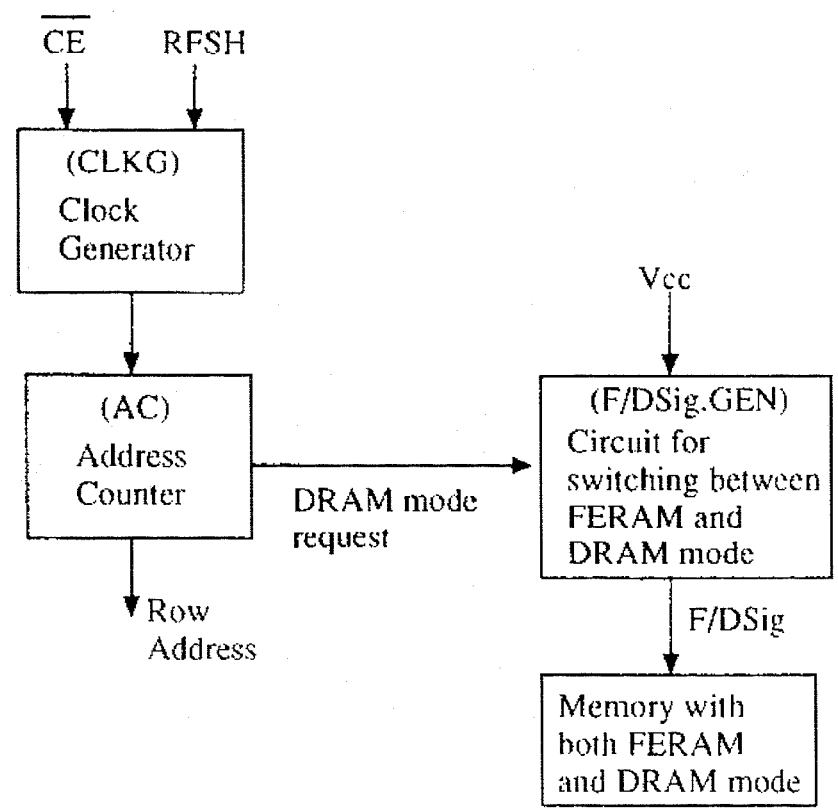
FIG. 9 is a connection diagram of the circuit for generating the switching signal between the FERAM mode and the DRAM mode showing an embodiment of the invention.

FIG. 9 is a diagram showing an embodiment of a method of generating the signal for switching between the FERAM and DRAM modes in the invention.

Although fundamentally similar to FIG. 8, FIG. 9 shows a method of generating a signal for shifting to the DRAM mode by using a part of the DRAM control section. Namely, the access operation of the memory cells at the time of the above recall operation in the FERAM mode is performed, for example, by sequentially counting up the row addresses by an internal address counter AC on the basis of clocks of a clock generator CLKG by a method similar to the auto refresh operation in the DRAM. The address counter AC can be commonly used as an address counter which is used in the auto refresh operation in the DRAM mode. When the recall operation is finished, since a carry signal is generated from the most significant bit of the AC, the switching circuit receives the carry signal and generates an output indicating that the memory is made operative in the DRAM mode, for example, an output at the high level as a mode switching signal F/D Sig. As another method, it is also possible to construct in a manner such that by detecting that the address counter AC reaches the maximum value, the memory is shifted to the DRAM mode.

It will be obviously understood that in order to prevent an erroneous operation such that the memory is shifted to the DRAM mode before the recall operations of all of the memory cells are not finished, the address counter is reset to 0 together with the turn-on of the power supply so that the first address of the recall operation is set to the address of the lowest order.

According to the embodiment, there is an effect such that the nonvolatile memory which can be handled in a manner similar to the DRAM without making the user of the memory be aware of the switching between the FERAM and DRAM modes in the memory can be obtained. Moreover, since the memory is operated as a DRAM mode, there is an effect such that as compared with the case of always switching the polarization of the ferroelectric capacitor film each time the information is read out as an FERAM mode, the fatigue of the ferroelectric capacitor film is small and the memory of the high reliability is obtained.

Figure 10:
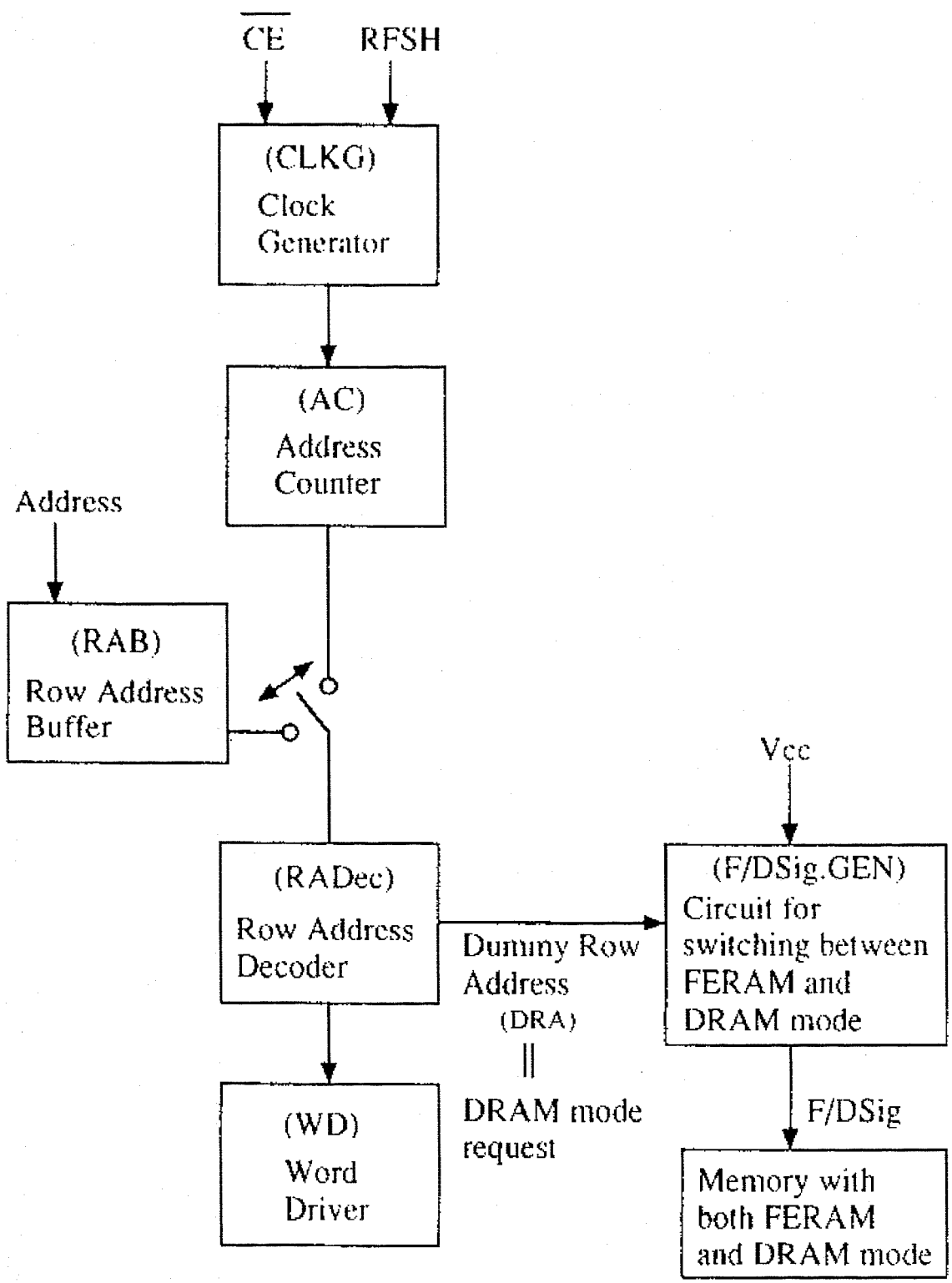
FIG. 10 is a connection diagram of the circuit for generating the switching signal between the FERAM mode and the DRAM mode showing an embodiment of the invention.

FIG. 10 is a diagram showing an embodiment of a method of generating the switching signal between the FERAM and DRAM modes in the invention.

The method of generating the signal to instruct the shift to the DRAM mode in FIG. 10 differs from that in FIG. 9 with respect to a point that the instruction signal is not directly transmitted from the address counter AC, but the instruction signal is sent from a decoder RADec to decode it to the switching signal generating circuit. For example, a dummy row address DRA is newly provided, thereby setting so as to generate the dummy row address DRA subsequently to the last row address in the recall operation which is executed in a manner similar to FIG. 9 at the time of turn-on of the power supply. For example, in the recall operation, by making the address counter AC operative by the clock from the clock generator CLKG, the counter output is decoded to the row address by a row address decoder RADec. One or a few word drivers WD corresponding to the row address is/are activated. However, in the case where the dummy row address DRA is generated, it is outputted to the F/D Sig.GEN, thereby informing the end of the recall operation.

Generally, in case of reading/writing the information as a DRAM, the switch is switched and the external address of a row address buffer RAB is fetched, thereby performing such a reading/writing operation.

According to the embodiment, there is an effect such that the nonvolatile memory which can be handled in a manner similar to the DRAM without making the user of the memory be aware of the switching between the FERAM and DRAM modes in the memory can be obtained. Moreover, since the memory is ordinarily operated as a DRAM mode, there is an effect such that as compared with the case of switching the polarization of the ferroelectric capacitor film each time the information is read out as an FERAM mode, the fatigue of the ferroelectric capacitor film is small and the memory with the high reliability can be obtained.

Figure 11:
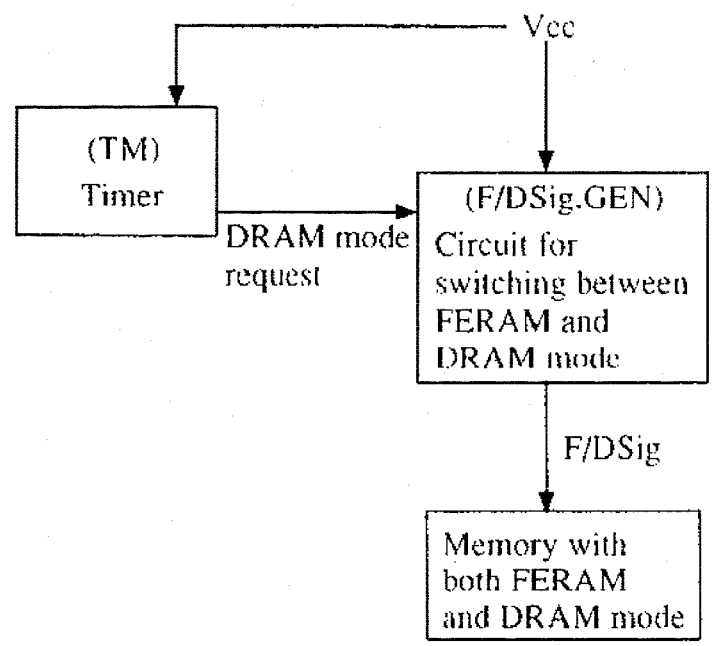
FIG. 11 is a connection diagram of the circuit for generating the switching signal between the FERAM mode and the DRAM mode showing an embodiment of the invention.

FIG. 11 is a diagram showing an embodiment of the method of generating the switching signal between the FERAM and DRAM modes in the invention.

In FIG. 11, a method of generating the signal to instruct the shift to the DRAM differs from that of FIG. 9 or 10. First, the turn-on of the power supply is detected and the signal F/D Sig is set to the FERAM mode in a manner similar to FIG. 8. At the same time, a timer built in the memory is operated. The timer can be constructed by using, for instance, a circuit similar to the circuit which is used in a pseudo static random access memory (SRAM). Since the time which is required for the recall operation has previously been known, after the elapse of time obtained by adding a margin to such a time, the end of the recall operation is informed to the F/D Sig.GEN by a signal from the timer. In response to such an end report, the F/D Sig.GEN generates a signal indicative of the DRAM mode. The fact that the recall operation is finished by a refresh operation signal RFSH within the time which has been predetermined by the timer and that the operations to read out and write the information cannot be performed within such a predetermined time is given as specifications to the user. The refresh operation signal RFSH can be also automatically produced in the memory. In such a case, since the time which is required for the recall operation is determined when the circuit is designed irrespective of the intention of the user, the timing for generating the DRAM mode designation signal from the timer may be determined on the basis of such a time. According to the embodiment of the invention, effects similar to those mentioned in FIGS. 9 and 10 can be obtained.

Figure 12:
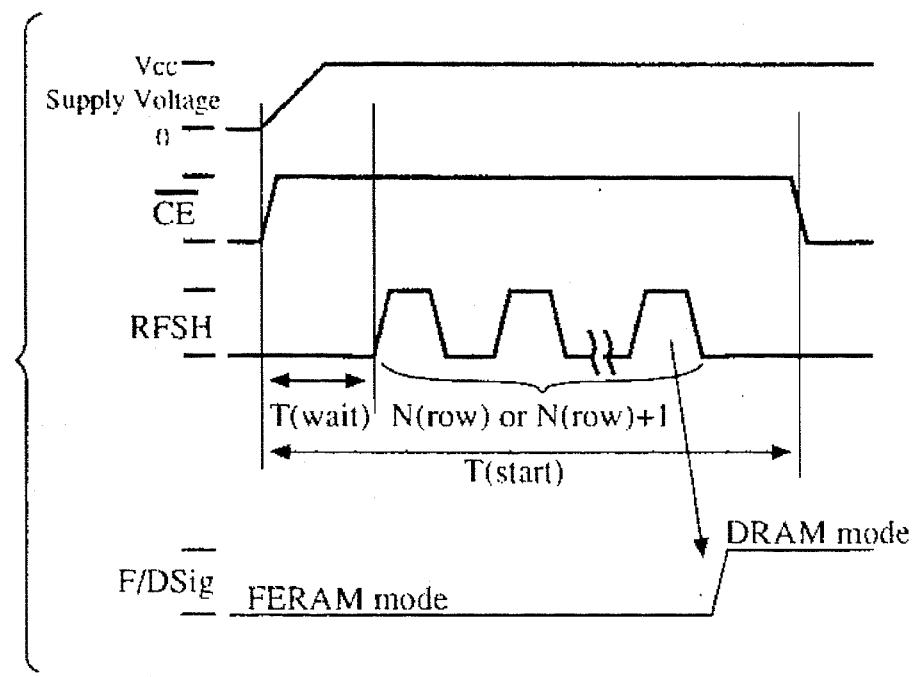
FIG. 12 is a timing chart showing an example of an external signal to designate the conversion from nonvolatile information to volatile information at the time of turn-on of the power supply in the invention.

FIG. 12 is a timing chart showing signals to be given from the outside in order to execute the conversion from the nonvolatile information into the volatile information, namely, the recall operation when the power supply is turned on in the embodiment of FIG. 9.

When the power supply is turned on, a chip nonselection signal $\overline{CE}$ is set to the high level. After the turn-on of the power supply, the memory is set into the standby mode for only a time T (wait) until an internal voltage of the memory reaches a stationary state. During such a waiting time T, the signal F/D Sig becomes stable and is set to the low level, namely, into a state in which the FERAM mode is given. The plate electric potential, word line electric potential, data line electric potential, and the like are also set into predetermined initial states, respectively. After the elapse of the time T (wait), the refresh operation signal RFSH is inputted N (row) times. In correspondence to that the signal F/D Sig is at the low level, the signal RFSH operates as a recall operation signal. N (row) denotes the number of times which is required for accessing all of the memory cells. The signal RFSH may be given from the outside or may be also formed in the memory. In response to the trailing edge of the N (row)-th RFSH signal, the address counter is returned to 0 from the maximum value and the carry signal is generated. As described in FIG. 9, the carry signal is a signal indicative of the end of the recall operation and changes the signal F/D Sig to the high level. After the elapse of the time T (start) which is required for such a recall operation, it is permitted to set the $\overline{CE}$ to the low level and to read out and write the information in substantially the same manner as the DRAM.

The time T (start) during which the reading and writing operations of the information are inhibited can be also given as a specification to the user. However, it is also possible to enable the user to access to the memory so long as the signal F/D Sig indicates the DRAM mode. That is, in the FERAM mode, for example, a flag to inhibit the use of the memory is outputted from one of the pins of the memory. On the other hand, during the period of time of the on-state of the power supply, it is necessary to execute the refresh operation in a manner similar to an ordinary DRAM. Such an operation is performed by inputting the RFSH signal. The RFSH signal functions as a refresh signal in that the signal F/D Sig is at the high level. In a manner similar to the pseudo SRAM, it is also possible to construct in a manner such that the refresh operation is executed every predetermined period of time in the memory and the memory is perfectly regarded as a nonvolatile memory from the user. The F/D Sig signal may be also changed from the low level to the high level in correspondence to the [N (row)+1]th RFSH signal.

As described in reference to FIG. 11, it is also possible to use another method such that the F/D Sig signal is automatically changed by using the timer after the elapse of a predetermined time. According to the embodiment, there are effects such that for the user of the memory, by merely performing the signal input similar to that in the auto refresh operation in the DRAM when the power supply is turned on, a nonvolatile memory which can be handled in a manner similar to a DRAM is obtained. In addition, since the RFSH signal can be used for both of the refresh operation signal and the recall operation signal in correspondence to the F/D Sig signal which is generated in the memory, there is an effect such that the nonvolatile memory which has a pin arrangement similar to that of the DRAM and which can be handled by a method similar to that of the DRAM can be obtained. The nonvolatile memory in which there is no need to switch the polarization of the ferroelectric capacitor film each time the information is read out and the fatigue of the film is small and the reliability is high can be obtained.

Figure 13:
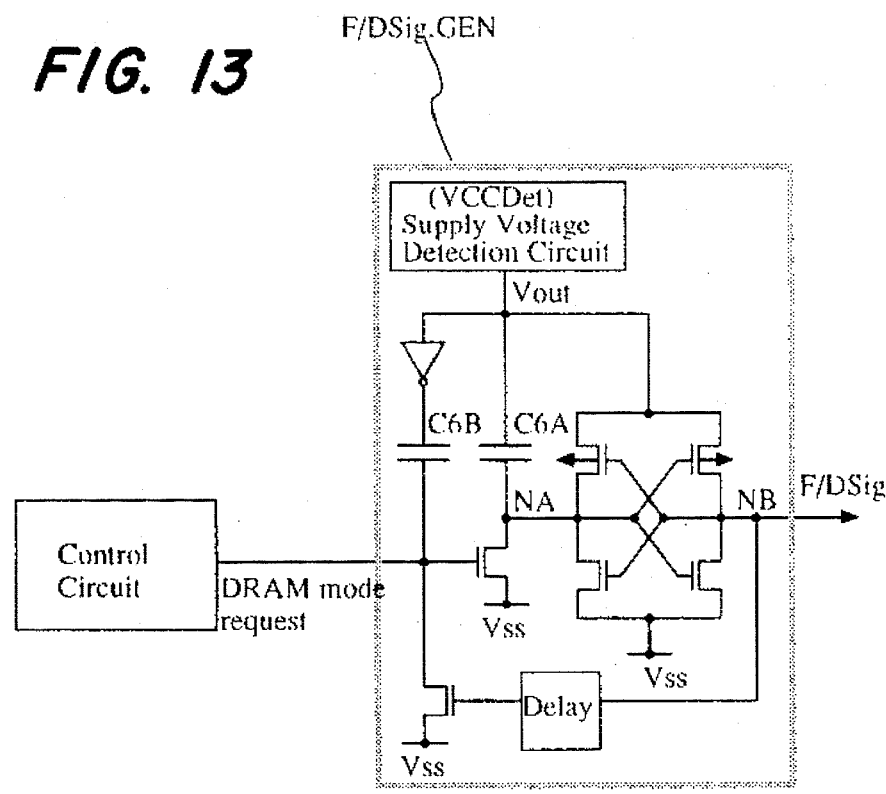
FIG. 13 is a constructional diagram of the circuit for generating the switching signal between the FERAM mode and the DRAM mode showing an embodiment of the invention.
Figure 14:
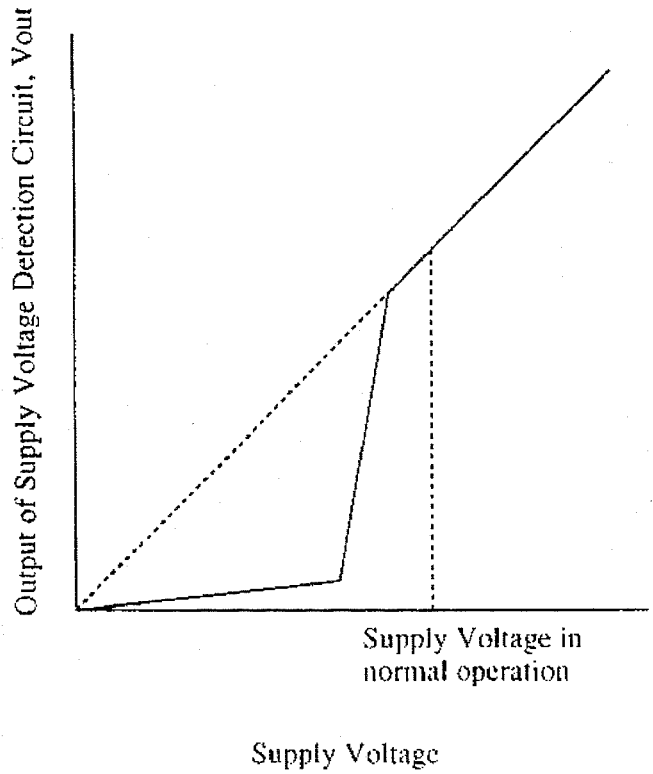
FIG. 14 is a diagram showing output characteristics of a power source voltage detection circuit in the embodiment as shown in FIGS. 6, 7, 13, and the like of the invention.

FIG. 13 is a constructional diagram of a circuit for switching between the FERAM mode and the DRAM mode showing an embodiment of the present invention. FIG. 14 is an output characteristic diagram of a power supply voltage detection circuit in FIG. 13.

The mode switching circuit F/D Sig. GEN in FIG. 13 includes a power supply voltage detection circuit VCCDet. The power supply voltage detection circuit VCCDet has output characteristics shown in FIG. 14. An output of the power supply voltage detection circuit VCCDet is almost 0 until the power supply voltage reaches a predetermined value. When the power supply voltage is equal to or larger than the predetermined value, the output of the detection circuit VCCDet coincides with the power supply voltage. Such a predetermined value of is set to a value about the lowest voltage that is necessary for allowing the memory circuit to stably operate.

In FIG. 13, when the power supply voltage exceeds the predetermined value, the output of the VCCDet rises up to the power supply voltage. An n-channel field effect transistor connected to Vss and a delay circuit is in the off state. An electric potential at one node (NA) of a flip-flop circuit is boosted through a capacitor C6A. Therefore, a node (NB) on the side which outputs the F/D Sig signal is latched to 0 V. As an effect which is obtained by providing the power supply voltage detection circuit VCCDet, there is an effect such that after the voltage has reached the voltage at which the flip-flop circuit stably operates, the flip-flop circuit is actuated and the voltage at one node (NA) is rapidly boosted through the capacitor, so that the voltage at the node (NB) on the side which outputs the F/D Sig signal is stably set to 0 V.

On the other hand, after completion of the recall operation, the DRAM mode designation signal from the control circuit is set to the high level and the voltage at the node (NA) on the side latched to the Vcc electric potential of the flip-flop circuit is dropped to 0 V by the turn-on of the n-channel field effect transistor. Thus, the F/D Sig signal is set to the high level and the memory is set to the DRAM mode. While the voltage at one node (NA) of the flip-flop circuit is boosted through the capacitor C6A at the time of turn-on of the power supply, the electric potential of the DRAM mode designation signal line is suppressed through a capacitor C6B so as not to increase due to a parasitic capacitance coupling or the like. Consequently, it is possible to prevent a situation such that while the voltage at one node (NA) of the flip-flop circuit is boosted, the electric potential of the DRAM mode designation signal line erroneously rises and the n-channel electric field transistor is turned on and the memory erroneously operates. Further, after the F/D Sig signal was set to the high level, the DRAM mode designation signal line is dropped to 0 V after a little while. Thus, a situation such that an electric potential higher than 0 V remains on the DRAM mode designation signal line at the time of turn-on of the power source, so that erroneous operation can be prevented.

According to the embodiments of FIGS. 13 and 14, a ferroelectric memory mode signal can be generated in the memory in correspondence to the turn-on of the power supply and the DRAM mode can be generated in response to the end of the recall operation. The user of the memory, therefore, can easily use the memory as a nonvolatile memory which operates by a signal similar to that of the DRAM without being aware of a fact that the FERAM mode and the DRAM mode are selectively switched and used in the memory. Moreover, there are advantages such that the memory is ordinarily made operative in the DRAM mode, so that the fatigue of the ferroelectric capacitor film along with the reading-out operation of the information is small and a memory of high reliability can be obtained.

Figure 15:
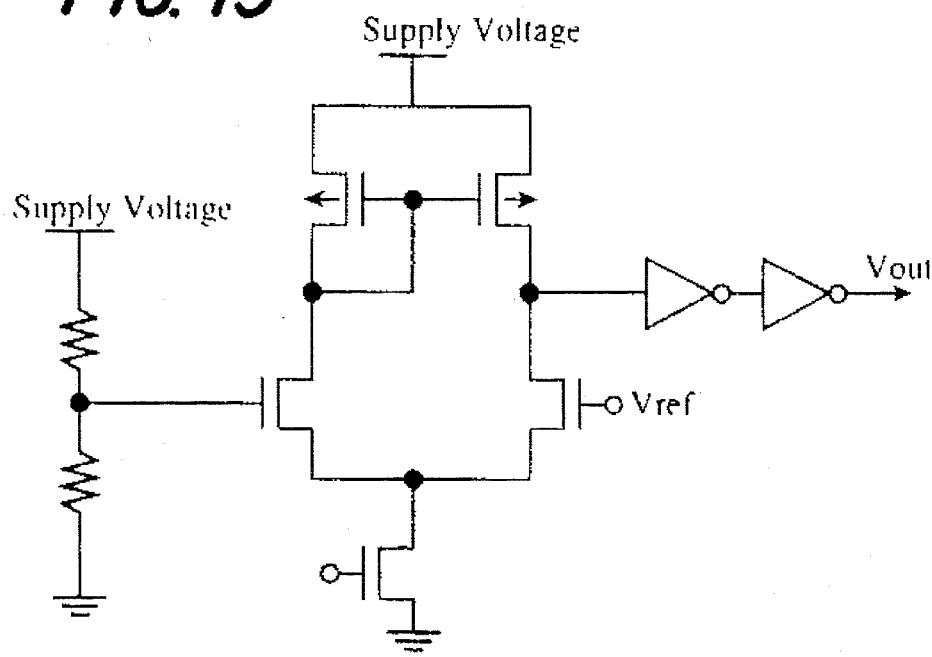
FIG. 15 is a diagram showing an example of a construction of the power source voltage detection circuit showing the output characteristics of FIG. 14.

FIG. 15 is a diagram showing an embodiment of the power supply voltage detection circuit which is used in the operation of FIGS. 6, 7, and 13. To obtain the output characteristics shown in FIG. 14, for example, the circuit using a differential amplifier as shown in FIG. 15 is available.

Figure 16:
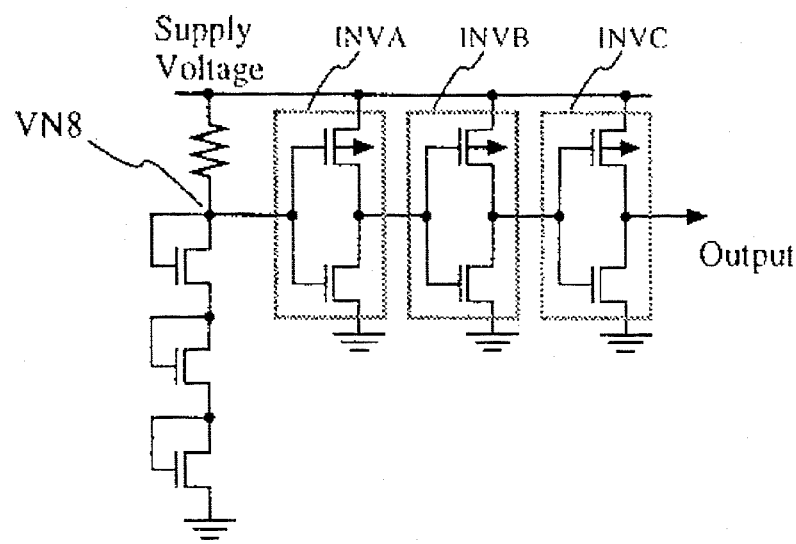
FIG. 16 is a diagram showing an example of a construction of the power source voltage detection circuit showing the output characteristics of FIG. 14.

FIG. 16 shows another specific circuit example of the power supply voltage detection circuit. FIG. 16 shows a power supply voltage detection circuit which is constructed by: a fixed resistor, and three serially connected n-channel field effect transistors which are connected under the power supply voltage; and three inverters INVA, INVB, and INVC which are serially connected.

Although the electric potential at the node VN8 gradually rises when the power supply is turned on, when it reaches a value that is about three times as high as a threshold voltage Vth of the three n-channel field effect transistors which are serially connected, the conduction of those transistors is started. By designing such that the on resistance of each of those n-channel field effect transistors is sufficiently smaller than a resistance on the Vcc side, a boosting amount of the electric potential at the node VN8 by the power supply suddenly decreases at a voltage of (3×Vth) or higher and shows a saturation tendency.

Therefore, an output of the inverter INVA is inverted from the low level to the high level at a point where the power supply voltage rises from 0 V and exceeds (6×Vth). By connecting the three inverters INVA, INVB, and INVC in a manner such that a channel width increases as the position approaches the post stage, the power supply voltage detection circuit of small DC current and large driving ability can be realized. By providing such a power supply voltage detection circuit VCCDet, for instance, as described in FIG. 13, the mode switching signal F/D Sig can be stably generated in response to the turn-on of the power supply.

Figure 17:
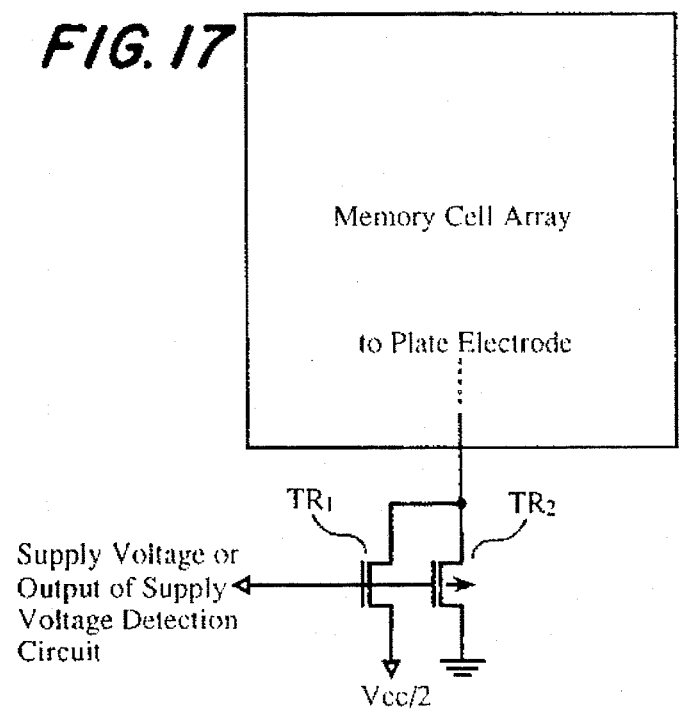
FIG. 17 is a diagram showing a construction of a plate electric potential supplying circuit in the embodiment of FIG. 1 of the present invention.

FIG. 17 is a circuit diagram showing a configuration of a circuit for supplying a plate electric potential in the ferroelectric memory array shown in FIG. 1.

The plate of the present embodiment is connected to the level of Vcc/2 through an n-channel field effect transistor TR1 and also is connected to the ground level 0 V through a p-channel field effect transistor TR2. The common gate of those MOS transistors is connected to either the terminal at the same potential level as that of the power supply or the output terminal of the power supply voltage detection circuit. During the normal operating state, the gate voltage of the p-channel MOS transistor is Vcc and the plate is electrically separated from the ground level. As soon as the power supply is turned off, the gate voltage of the n-channel MOS transistor becomes 0 V, the plate is electrically separated from the level of Vcc/2, and also the gate voltage of the p-channel MOS transistor becomes 0 V, whereby the p-channel MOS transistor is turned on and the plate electric potential is speedily dropped down to 0 V. Now, the parasitic capacity which is loaded on the above-mentioned gate is made as small as possible so that as soon as the power supply is turned off, the plate electric potential can be speedily dropped down to 0 V.

As described above, according to the present embodiment, as soon as the power supply is turned off, the plate voltage can be speedily dropped down to 0 V with the simple circuit configuration. Therefore, it is possible to obtain highly reliable ferroelectric memory in which even when the power supply is forced to be turned off due to the unexpected trouble, the polarization of the ferroelectric film is definitely not switched, and thus the information is not destroyed at all.

Figure 18:
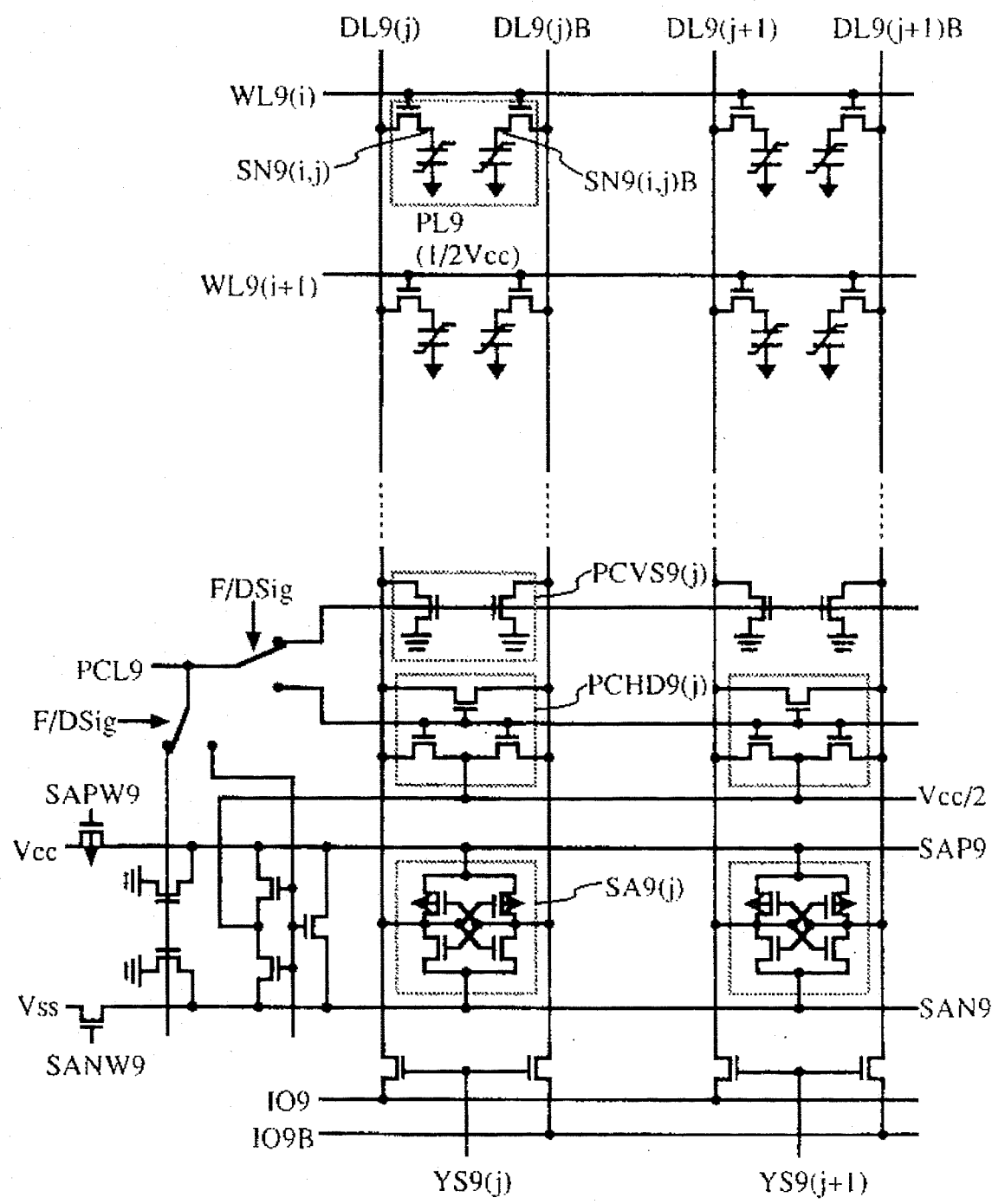
FIG. 18 is a constructional diagram of a precharge circuit showing an embodiment of the invention and shows a method of switching between the FERAM mode and the DRAM mode by an F/D Sig.

FIG. 18 is a diagram of a configuration of a memory array showing another embodiment of the invention. Although the fundamental array configuration is similar to FIG. 1, the signal F/D Sig for switching between the FERAM mode and the DRAM mode is specifically shown. In FIG. 18, the memory cell is constructed by two transistors and two capacitors. However, as will be explained hereinafter, the memory cell can be also constructed by one capacitor and one transistor in a manner similar to FIG. 1.

In FIG. 18, a Vcc/2 precharge circuit and a Vss precharge circuit of the same construction are provided for each of the data lines connected to the memory cells and sense circuits for amplifying the signals on the data lines. By selecting the precharge circuit used in the operation by the F/D Sig signal, the operation mode can be easily switched. In FIG. 18, the memory cell is constructed by two transistors and two capacitors. The polarization states and electric potentials of two capacitor nodes are complementarily set and are detected by a differential sense amplifier SA9(j) or the like. The memory cell can be also constructed by one capacitor and one transistor in a manner similar to the DRAM. In this case, only in case of the FERAM mode, the dummy cell is used. Therefore, the switching operation is executed by the F/D Sig signal in a manner such that the dummy cell is set to the active state in the FERAM mode and is set to the inactive state in the DRAM mode.

In FIG. 18, when the F/D Sig signal is at the low level, namely, in the FERAM mode, the precharge levels of the drive line of the sense amplifier SA9(j) and the like, and data line DL9(j) and the like are set to 0 V. When the F/D Sig signal is set to the high level, namely, in the DRAM mode, the precharge levels of the drive line of the sense amplifier SA9(j) and the like, and data line DL9(j) and the like are set to Vcc/2.

The above operations are executed by connecting a precharge signal line PCL9 to either one of a 0 V precharge circuit PCVS9(j) and the like or a Vcc/2 precharge circuit PCHD9(j) and the like in accordance with the level of the F/D Sig signal. By using the above memory array configuration, as shown in timing charts of FIGS. 20 and 22, which will be explained hereinafter, the conversion from the nonvolatile information to the volatile information is performed in the FERAM mode and the ordinary DRAM operation is executed in the DRAM mode by substantially the same operations.

Namely, according to the embodiment, there is an effect such that the operation modes can be switched by the F/D Sig signal by the extremely simple circuit construction and circuit operation. Further, as an effect which is obtained by making the memory operative as a DRAM of the Vcc/2 plate and the Vcc/2 data line precharge in the normal state, there is an effect such that the polarization switch of the ferroelectric capacitor film along with the reading operation of the information and the fatigue of the film and reduction of the read speed due to the polarization switch can be avoided. Since the electric potential at the capacitor node and the polarization state of the ferroelectric capacitor film always correspond to each other, there is an effect such that it is possible to obtain memory in which even if the power supply is turned off without executing any special conversion operation from the volatile information to the nonvolatile information, the information can be stored and which is immune to the unexpected turn-off of the power supply.

Figure 19:
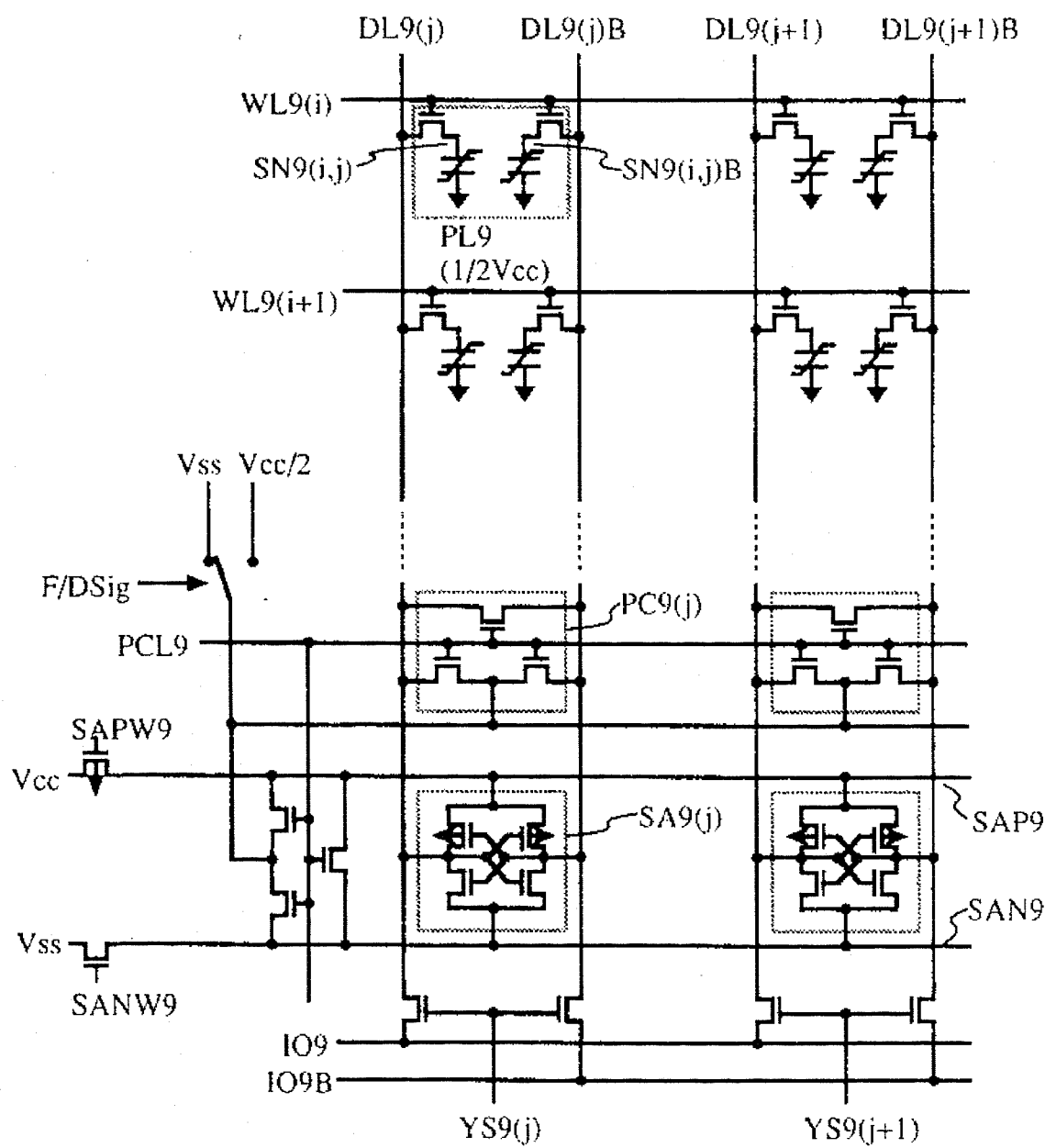
FIG. 19 is a constructional diagram of a precharge circuit showing another embodiment of the invention and shows a method of switching between the FERAM mode and the DRAM mode by the F/D Sig.

FIG. 19 is a diagram showing a configuration of a memory array in which the operation mode of the memory can be easily switched by the F/D Sig signal in a manner similar to FIG. 18.

Different from FIG. 18, in FIG. 19, the precharge circuit PC9(j) is common to the 0 V precharge and the Vcc/2 precharge and the power supply line which gives the precharge level is switched to 0 V (Vss) or Vcc/2 by the F/D Sig signal.

According to the embodiment, in addition to effects similar to those in FIG. 18, since the precharge circuit is commonly used, a higher density of the memory array can be accomplished. In FIGS. 18 and 19, it will be obviously understood that the Vcc precharge can be also used in the FERAM mode.

Figure 20:
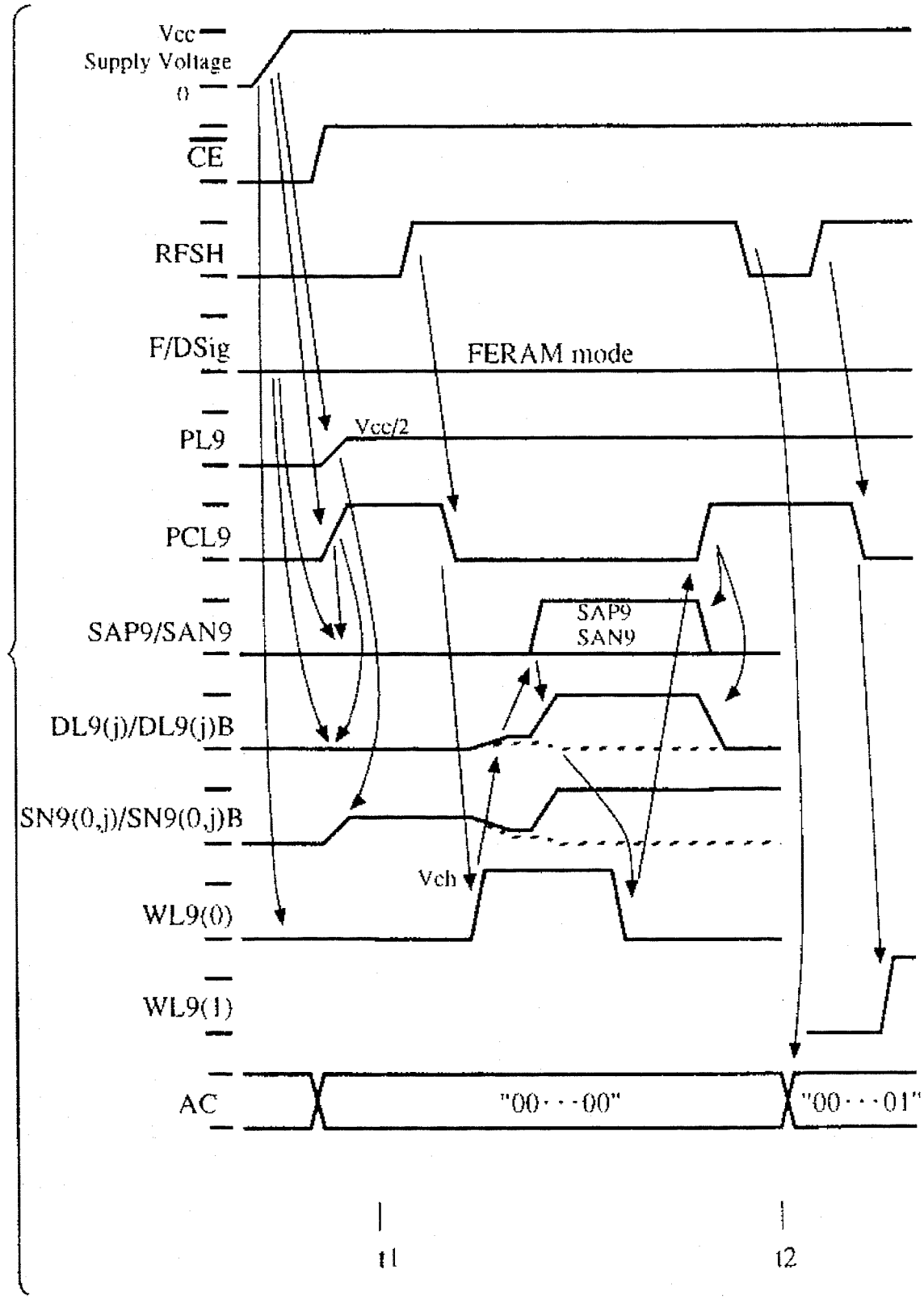
FIG. 20 is a timing chart in the FERAM mode at the time of turn-on of the power supply in a memory array in FIG. 18 or 19.

FIG. 20 is a timing chart showing waveforms in the converting operation from the nonvolatile information to the volatile information in the FERAM mode at the time of turn-on of the power supply in the memory array in FIG. 18 or 19. Although fundamentally similar to the timing charts described in FIG. 5, the relations among the signal F/D Sig, the signal RFSH, and the address counter AC are also shown together.

First, when the power supply is turned on, a plate electric potential PL9 is set to the level of Vcc/2 in a manner similar to the ordinary DRAM. Since the electric potentials of a word line WL9(0) and the like are suppressed to 0 V for such a period of time, the electric potentials at nodes SN9(0,j), SN9(0,j)B, and the like on the data line side of the ferroelectric capacitor are also boosted to values near Vcc/2 along with the increase in PL9. Since SN9(0,j), SN9(0,j)B, and the like are in the floating state, a large voltage is not applied to the ferroelectric capacitor due to the increase in PL9, so that the nonvolatile information as a polarization state of the film is not destroyed.

On the other hand, the precharge signal line PCL9 is set to the high level and in correspondence to that the signal F/D Sig is at the low level, the drive line of the sense amplifier SA9(j) and the like, and data line DL9(j) and the like are precharged to 0 V. The address counter is initialized to 0. The recall operation shown in FIG. 12 is started at a time t1 when each signal line, power supply line, and address counter are stabilized to the above initial states.

That is, the signal RFSH is set to the high level in a state in which the chip non-selection signal $\overline{CE}$ is at the high level. In response to the high level signal, the signal line PCL9 is set to the low level and the data line is set into a floating state of 0 V. Subsequently, the word line, for example, WL9(0) is set to the electric potential Vch higher than Vcc.

Since the electric potentials of the data lines DL9(j), DL9(j)B, and the like are equal to 0 V and the electric potentials at the capacitor nodes SN9(0,j), SN9(0,j)B, and the like are set to values near Vcc/2, the electric potential of the data line rises to the intermediate value between 0 V and Vcc/2 in accordance with the ratio of the capacitance of the memory cell and the parasitic capacitance of a data line. In this instance, a difference occurs between the electric potentials of the pair of data lines DL9(j) and DL9(j)B, and the like because the polarization states of the two complementary capacitors are opposite. The reason why such a difference occurs is because since the electric potential of the plate PL9 is equal to Vcc/2, electric fields in the same direction are applied to the two capacitors and the polarization states are finally aligned to the same direction. To the capacitor on the side whose polarization is switched, surplus charges for compensating the polarization charges flow and the substantial capacitance of the memory cell increases. Therefore, the electric potential of the data line which is connected to the capacitor on the side whose polarization is switched is set to a value that is nearer to Vcc/2. When a small electric potential difference occurs between the electric potentials of the complementary data lines, it is detected by the differential sense amplifier SA9(j) and the like. That is, a drive line SAP9 for the sense amplifier is driven to Vcc and the electric potentials of the data lines are amplified to 0 V and Vcc. After completion of the amplification, by returning the electric potential of the word line WL9(0) to 0 V, the volatile information of 0 V or Vcc corresponding to the polarization state of the capacitor film before the power supply is turned on is held as the electric potentials at the capacitor node SN9(0,j), SN9(0,j)B, or the like.

Finally, the electric potentials of the drive lines SAP9 for the sense amplifier and the like are returned to 0 V. In this manner, the recall operation with respect to the memory cell connected to one word line WL9(0) is finished at a time t2. By returning the RFSH signal to the low level, the address counter is counted up. Subsequently, by setting the RFSH signal to the high level, the next word line WL9(1) is selected in a manner similar to the auto refresh operation in the DRAM and the recall operation of the memory cell connected to WL9(1) is executed. By executing the recall operation with respect to all of the memory cells as mentioned above, the conversion from the nonvolatile information to the volatile information is finished. The electric potential at the capacitor node of the memory cell in which the recall operation is executed at a time near the final time gradually decreases from an electric potential near Vcc/2 by the leakage current. However, the time which is required for the recall operation is almost equal to the time required for the auto refresh operation and is a short time of 1/100 or less of the time during which the DRAM can hold the information without the refresh operation. Therefore, no problem occurs on the operation.

According to the embodiment, since the recall operation is completed by merely executing a procedure similar to the auto refresh operation of the DRAM after the power supply was turned on, there is an advantage such that a nonvolatile memory of an extremely good use efficiency can be obtained. It is noted that, in the case where the electric potential of the plate is set to Vcc/2 and the memory is made operative in the FERAM mode, when the capacitor node of the memory cell is set to an electric potential which is fairly different from Vcc/2, a unidirectional electric field is applied to the ferroelectric film and the nonvolatile information stored as a polarization state is destroyed. For example, if each power supply line or a signal line is unexpectedly fluctuated at the time of turn-on of the power supply, the nonvolatile information may be destroyed. Or, as mentioned above, since the electric potential of the memory cell gradually decreases from an electric potential near Vcc/2 by the leakage current, when the operation is continued in the FERAM mode for a critical period of time or longer, the nonvolatile information is destroyed. On the other hand, according to the embodiment of the invention regarding the conversion from the nonvolatile information to the volatile information described in FIG. 5, 6, or 20, there is an effect such that the high reliable nonvolatile memory in which the information stored as nonvolatile information is not extinguished when the power supply is turned on is obtained.

Figure 21:
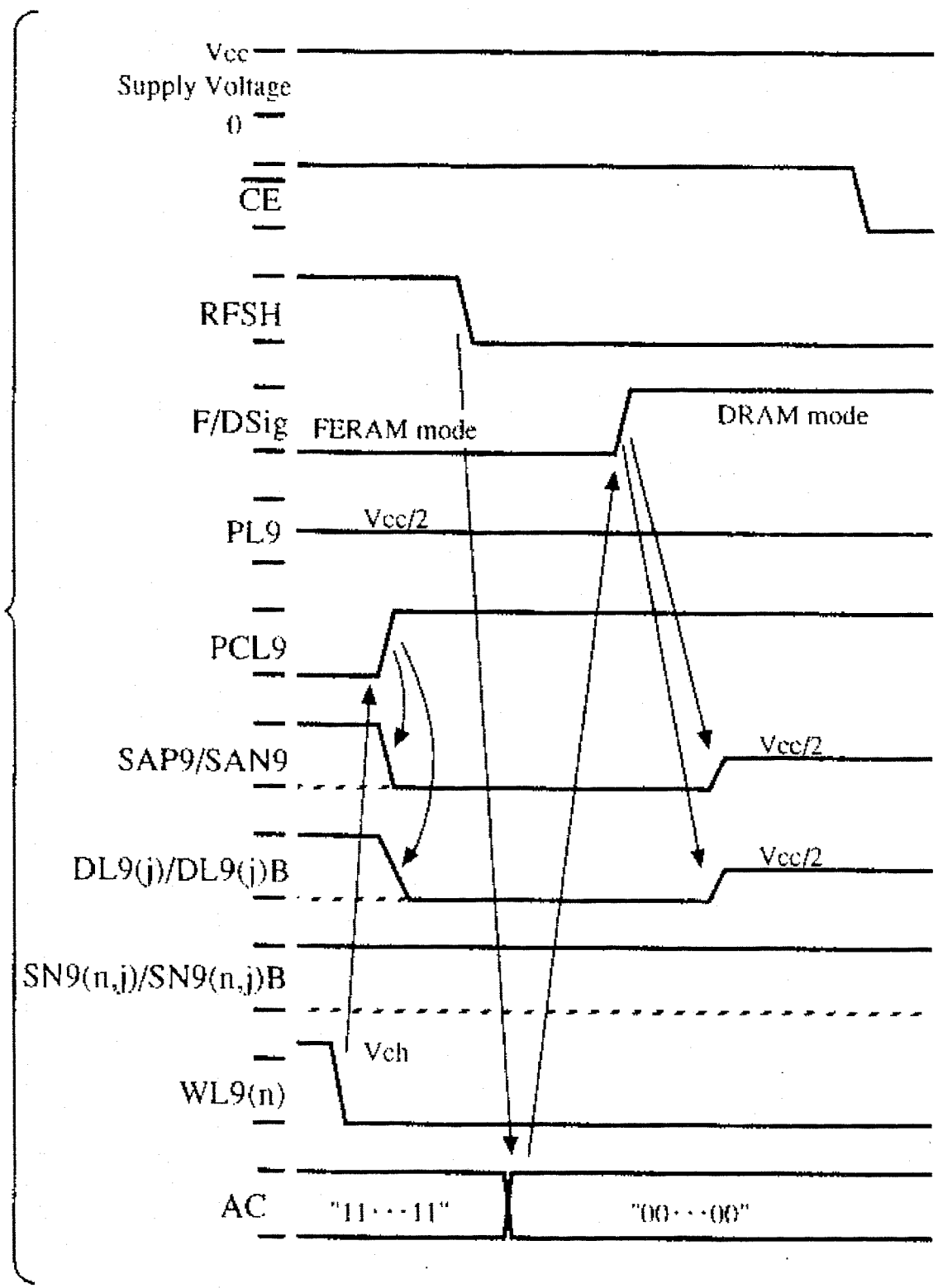
FIG. 21 is a timing chart when shifting from the FERAM mode to the DRAM mode at the end of the recall operation in the memory cell array in FIG. 18 or 19.

FIG. 21 is a timing chart showing a method of shifting from the FERAM mode to the DRAM mode at the end of the recall operation in the memory array in FIG. 18 or 19.

After completion of the recall operation regarding the memory cell connected to the last word line WL9(n), the word line WL9(n) is returned to the low level. After that, the precharge signal line PCL9 is set to the high level. In this instance, since the memory is still held in the FERAM mode, the drive lines SAP9 and SAN9 for the sense amplifier and the pair of data lines DL9(j) and DL9(j)B are precharged to 0 V (Vss). When the RFSH signal is returned to the low level after the end of the recall operation, the address counter AC is reset from the maximum value to 0. Thus, in response to the carry signal which is generated, the signal F/D Sig is changed from the low level to the high level. The memory is shifted from the FERAM mode to the DRAM mode. The drive lines SAP9 and SAN9 for the sense amplifier and the pair of data lines DL9(j) and DL9(j)B are again precharged to Vcc/2. After that, the memory operates as a DRAM mode and it is permitted to execute the reading and writing operations of the information.

According to the embodiment, since the switching from the FERAM mode to the DRAM mode is automatically executed, there is an effect such that the nonvolatile memory of an extremely good use efficiency for the user of the memory is obtained.

Figure 22:
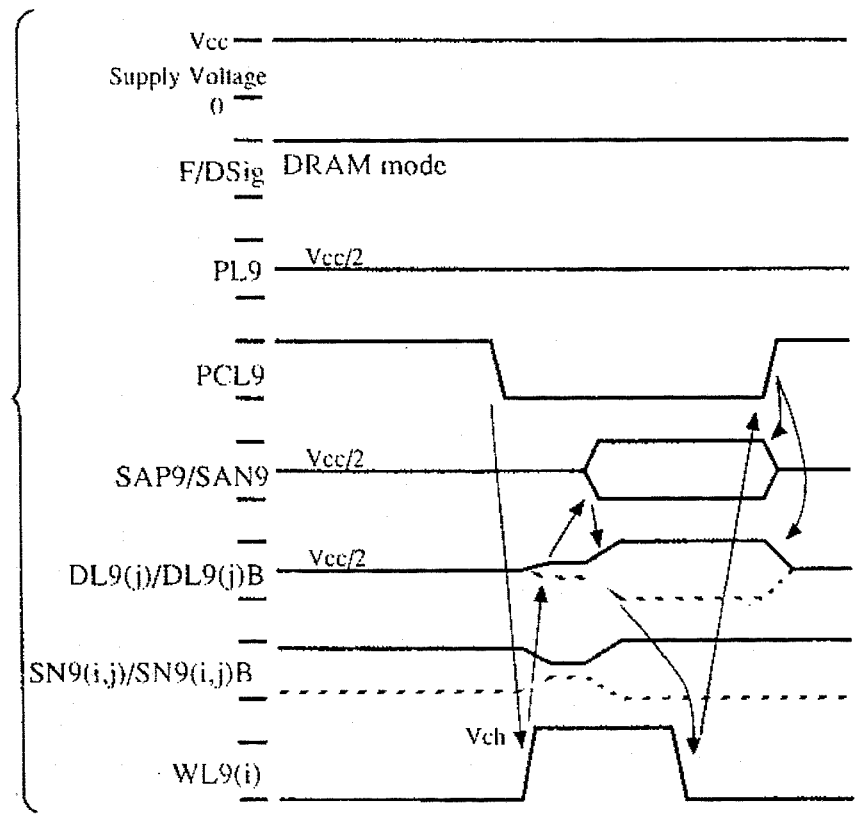
FIG. 22 is a timing chart in the DRAM mode in the memory array in FIG. 18 or 19.

FIG. 22 is a timing chart showing operation waveforms as a DRAM mode in the ordinary operating state in the memory array of FIG. 18 or 19. Although FIG. 22 is fundamentally similar to the timing chart described in FIG. 3 or 4, the relation with the signal F/D Sig is also included and shown.

In response to the high level indicating that the signal F/D Sig is set to the DRAM mode, the drive lines SAP9 and SAN9 for the sense amplifier and the pair of data lines DL9(j) and DL9(j)B and the like have been precharged to Vcc/2. To execute the information read operation, first, the precharge line PCL9 is set to the low level, thereby setting SAP9, SAN9, DL9(j), DL9(j)B, and the like into the floating state. Subsequently, the word line, for example, WL9(i) is set to the voltage Vch higher than Vcc. Thus, a small electric potential difference occurs between the electric potentials of the pair of data lines in correspondence to the electric potentials held at the capacitor nodes SN9(i,j), SN9(i,j)B, and the like. The electric potential difference is amplified to Vcc and 0 V by turning on switches SAPW9 and SAPW9 and driving the sense amplifier SA9(j) and the like. After that, by turning on a Y selection line YS9(j) and the like, the information can be read out from input/output lines I09 and I09B. To rewrite the information, the sense amplifier is switched by the inputs from the input/output lines I09 and I09B at this stage. Thus, the electric potentials at the capacitor nodes and the polarization state of the capacitor film are switched so as to coincide with each other. To finish the operation, after the word line WL9(i) was returned to the low level, the precharge signal line PCL9 is returned to the high level and the drive lines SAP9 and SAN9 for the sense amplifier and the pair of data lines DL9(j) and DL9(j)B and the like are returned to the level of Vcc/2.

As will be obviously understood from the above series of timing charts, the input of the signal is substantially the same as that in case of the FERAM mode of FIG. 20 except a point that the signal F/D Sig is at the high level. It will be also obviously understood that the auto refresh operation is automatically performed by merely setting the RFSH signal to the high level when the signal F/D Sig is at the high level. According to each of the embodiments of the invention shown in FIGS. 18 to 22 mentioned above, there is an effect such that the nonvolatile memory which can be handled in a manner similar to the DRAM for the user of the memory can be obtained by merely provide the extremely simple circuits such as internal circuit for generating the switching signal F/D Sig between the FERAM and DRAM modes in response to the turn-on of the power supply or the like and switching circuit for changing the precharge levels of the data lines and the like in correspondence to the signal F/D Sig. Further, as an effect for generally making the memory operative as a DRAM of the plate at Vcc/2 and the data lines at Vcc/2 precharge, there are effects such that the polarization switch of the ferroelectric capacitor film along with the reading of the information doesn't occur and the fatigue of the film and the reduction of the read speed along with the polarization switch can be avoided. Since the electric potentials at the capacitor nodes and the polarization state of the ferroelectric capacitor film always correspond to each other, there is an effect such that it is possible to obtain the memory which can remain the information even if the power supply is turned off without executing any special converting operation from the volatile information to the nonvolatile information and which is strong against the unexpected turn-off of the power supply. That is, according to the embodiment, there is an effect such that the nonvolatile memory which can be easily designed and in which the reliability is high and is easy to handle is obtained. In FIGS. 18 to 22, the method of precharging the data lines and the like to 0 V in the FERAM mode has been described. However, the invention can be also applied to a method of precharging them to Vcc. Although FIGS. 18 to 22 have been described with respect to the system of setting the plate to Vcc/2, it will be obviously understood that the method of the present invention in which the switching signal F/D Sig between the FERAM and DRAM modes is generated by the internal circuit in correspondence to the turn-on of the power supply or the like is effective even in the case of using the conventional system of driving the plate line in the FERAM mode or the conventional system in which the plate is set to Vcc or Vss in the DRAM mode.

Second Embodiment

Figure 23:
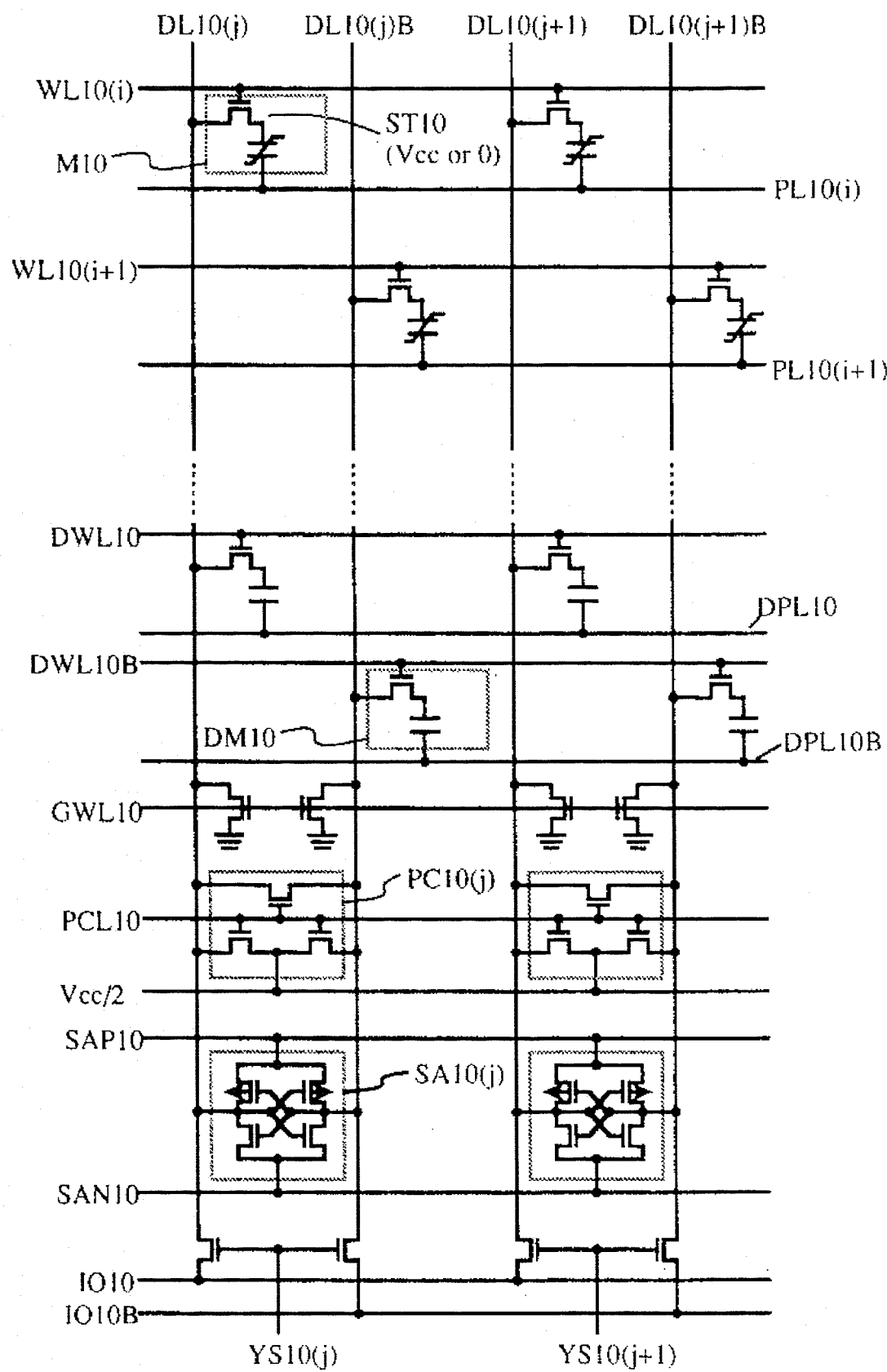
FIG. 23 is a diagram showing an array configuration of a ferroelectric memory in an embodiment of the invention.

FIG. 23 is a circuit diagram showing an array configuration of a ferroelectric memory in the second embodiment of the present invention.

In the first embodiment (refer to FIG. 1), the plate is common to all the memory cells, whereas in the present embodiment shown in FIG. 23, the plate is common to only the memory cells which are connected to the common word line, and thus a plurality of plate lines PL10(i) and the like are necessarily provided. In the present embodiment, in the normal operating state, the ferroelectric memory is used as the volatile memory in the same way as that in FIGS. 3 and 4. On the other hand, when converting the nonvolatile information into the volatile information at the time of turning the power supply on, on the basis of the operation method as will hereinbelow be described, for the memory cells connected to the activated word line, only the electric potential on the associated plate line is selectively boosted to read out the nonvolatile information.

Figure 24:
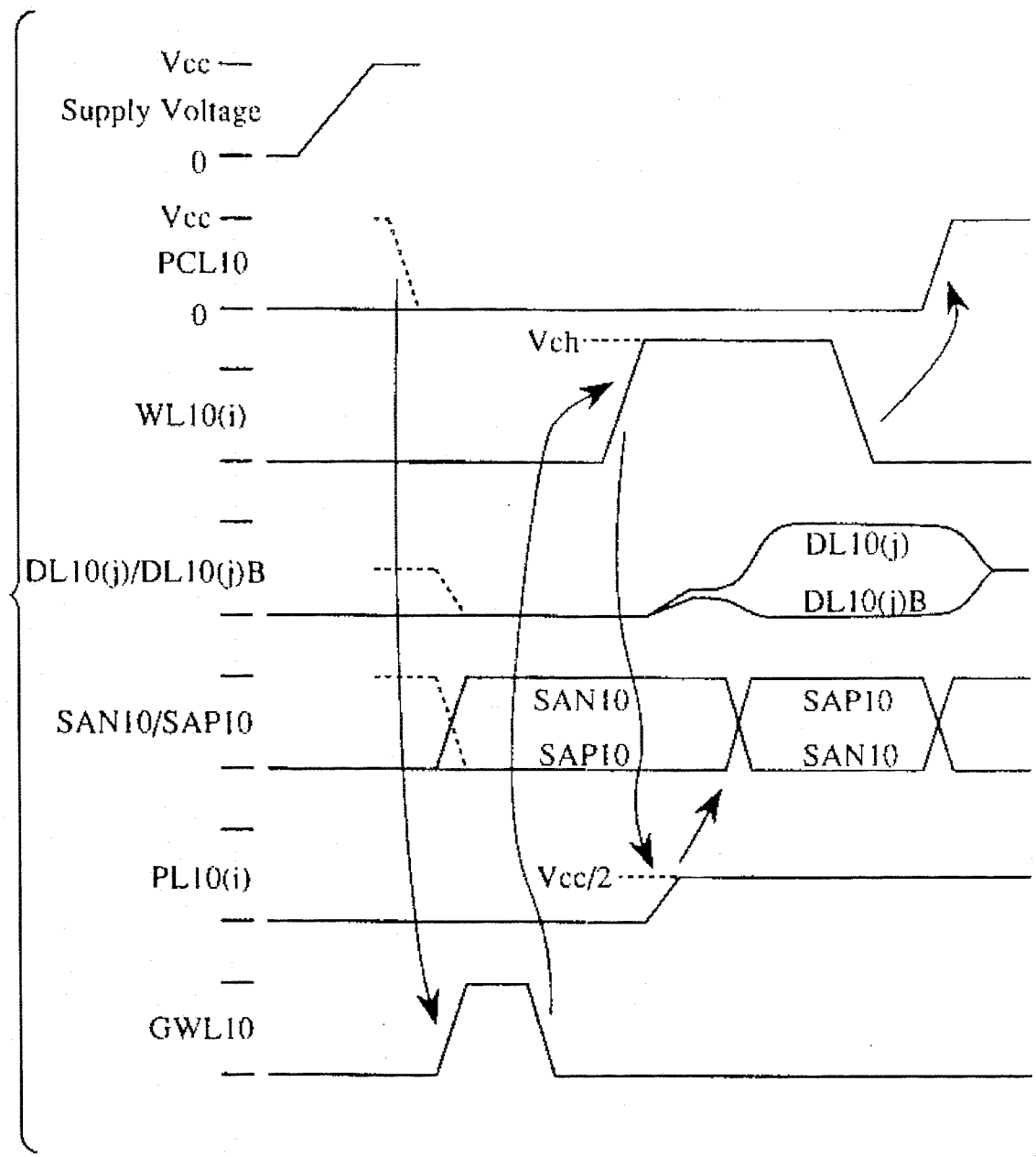
FIG. 24 is a timing chart showing the operation of converting from the nonvolatile information to the volatile information at the time of turn-on of the power supply in a memory cell array in FIG. 23.

FIG. 24 is a timing chart showing the operation of converting the nonvolatile information into the volatile information, which is performed when the power supply is turned on, in the memory cell array shown in FIG. 23.

In the present embodiment, just after the power supply has been turned on, all the nodes are at the ground level 0 V. First, the electric potential on a signal line SAN10 is made Vcc to deactivate the sense amplifier and also the electric potential on a grounding word line GWL10 is made Vcc to make surely the electric potential on the pair of data lines 0 V. After the electric potential on the grounding word line GWL10 is returned to 0 V to make the pair of data lines in the floating state, a word line WL10(i) is activated. Next, if the plate line of the group of memory cells connected to that word line is boosted up to Vcc/2, the associated data line is boosted through the ferroelectric capacitor. Since the degree of boost of the electric potential varies depending on the polarization state of the ferroelectric capacitor, if that degree of boost of the electric potential is detected, the nonvolatile information can be read out. In this connection, the same dummy cell as that described with reference to FIG. 5 is provided on a complementary data line DL10(j)B side so that the voltage to be the reference is generated. The signal relating to the small voltage difference between the pair of data lines is amplified by activating the sense amplifier through the signal lines SAN10 and SAP10. Finally, if the word line is deactivated and the sense amplifier is also deactivated, the operation of converting the nonvolatile information into the volatile information will be completed. If the above-mentioned conversion operation is performed with respect to all the word lines WL10(i) (i=1, 2, . . . , n), all the nonvolatile information can be converted into the volatile information. But, after the power supply has been turned on, in the second and subsequent activation of the word lines, as shown by dotted lines in FIG. 24, the electric potential on the signal line SAP10 needs to be decreased from Vcc down to 0 V. In addition, in FIG. 24, whenever the conversion operation has been completed with respect to one word line, the signal line PCL10 is activated and also the associated pair of data lines are precharged up to Vcc/2. Along with this operation, in the second and subsequent activation of the word lines, as shown by the dotted lines in FIG. 24, it is required that first, the signal line PCL10 is deactivated, and then the signal line GWL10 is activated to decrease the electric potentials on the associated pair of data lines from Vcc/2 down to 0 V. However, when the conversion operation has been completed with respect to one word line, the signal line PCL10 is not necessarily activated.

As described above, according to the present embodiment, when boosting the plate line, the polarization states of the ferroelectric capacitors connected to that plate line are always detected. Therefore, there is provided the effect that the operation of converting the nonvolatile information into the volatile information is stably performed. That is, while the non-volatile information in a certain ferroelectric capacitor is read out, there is absolutely no possibility that the information in the non-selective ferroelectric capacitors may be destroyed.

Figure 25:
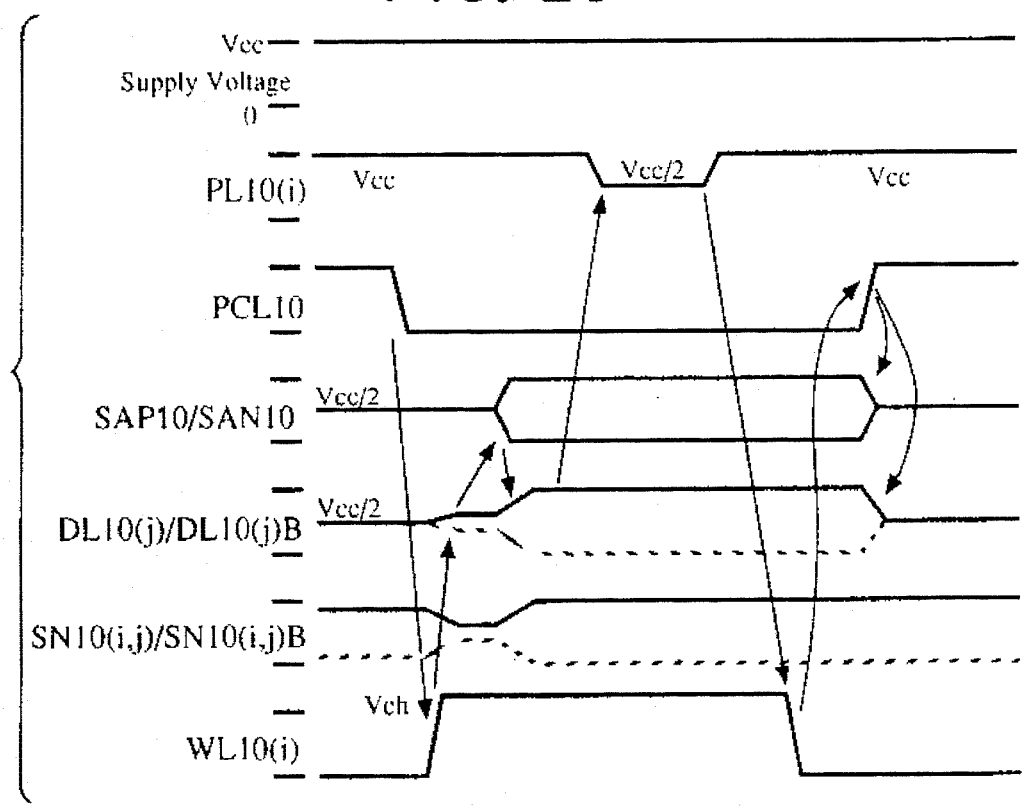
FIG. 25 is a timing chart in the array configuration of FIG. 23 and shows a method of periodically converting from the volatile information to the nonvolatile information.

FIG. 25 is an operation timing chart showing another embodiment of the invention. FIG. 25 shows a method whereby in the array configuration shown in FIG. 23, by selectively using either one of the FERAM mode and the DRAM mode, the nonvolatile memory of the high reliability can be obtained. That is, for a period of time when the memory is used as a DRAM mode, for example, at the time of the refresh operation or the like, the converting operation is sometimes performed. Thus, the number of switching times of the polarization can be reduced.

As shown in FIG. 25, in case of using the memory in the DRAM mode, the voltage at the plate line PL10(i) is set to Vcc or Vss. Thus, even when the information is rewritten, the volatile information as a node electric potential is merely rewritten and the nonvolatile information as a polarization state of the ferroelectric capacitor is not changed. Therefore, the fatigue of the film along with the polarization switch upon rewriting doesn't occur. However, since the volatile information and the nonvolatile information don't correspond to each other in such a state, the conversion from the volatile information to the nonvolatile information is periodically performed. Namely, at the time of the refresh operation in the DRAM mode, the electric potentials at the data line DL10(j) and the like are amplified. At the stage at which the volatile information is again written, the electric potential at the plate line PL10(i) is changed from Vcc (or Vss) to Vcc/2. Or, the electric potential at PL10(i) may be also changed from Vcc to Vss. Consequently, the electric field in the direction corresponding to the volatile information is applied to the ferroelectric capacitor and the nonvolatile information is stored as a polarization state. It is not always necessary to execute such a conversion from the volatile information to the nonvolatile information every time of the refresh operation but may be also performed at a proper period. To prevent a destruction of the volatile information along with the driving of the plate line, the plate line is not common to all of the memory cells but is separated on a word line unit basis as shown in FIG. 23. According to the embodiment of the invention, there is an effect such that the number of switching times of the polarization can be reduced and the high reliable nonvolatile memory is obtained.

Third Embodiment

Figure 26:
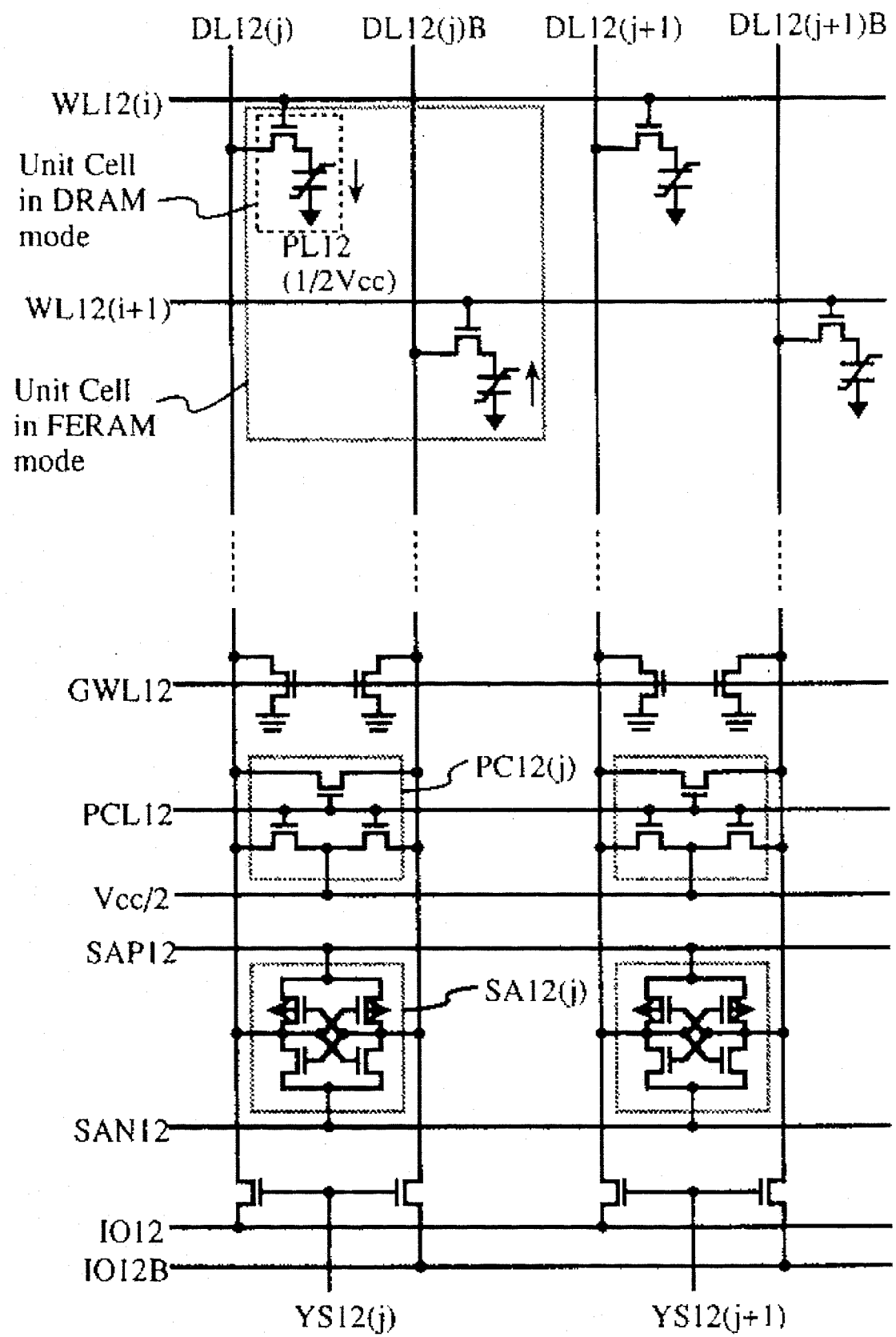
FIG. 26 is a diagram showing an array configuration of a ferroelectric memory in an embodiment of the present invention.

FIG. 26 is a circuit diagram showing an array configuration of a ferroelectric memory in the third embodiment of the present invention.

In the case where the volatile information is to be stored in the ferroelectric memory of the present embodiment, one memory cell is used as a unit of storage. On the other hand, in the case where the nonvolatile information is to be stored in the ferroelectric memory of the present embodiment, two memory cells are used as a unit of storage. Then, the polarization of one state is recorded in the ferroelectric capacitor of one memory cell and the polarization of the opposite state is recorded in the ferroelectric capacitor of the other memory cell. The operation of reading out the nonvolatile information is performed in the same way as that in the operation method of FIG. 5. But, no dummy cell is employed, and also the word lines WL12(i) and WL12(i+1) which are connected to the two memory cells, respectively, are simultaneously activated. The nonvolatile information which has been read out is complementarily converted to be stored as the volatile information in the two memory cells. That is, the nonvolatile information is complementarily converted into the storage voltages corresponding to the polarization states opposite to each other of the respective ferroelectric capacitors. In the normal operation in which the ferroelectric memory acts as the volatile memory, since only the information which is stored in one of the two memory cells is sufficient, the other memory cell can be used to store the information to be stored which is used for only the temporary calculation and does not need to be left in the form of the nonvolatile information. As described above, according to the present embodiment, no dummy cell is required when reading out the nonvolatile information, and the operation as the nonvolatile memory can be further stably performed.

Fourth embodiment

Figure 27:
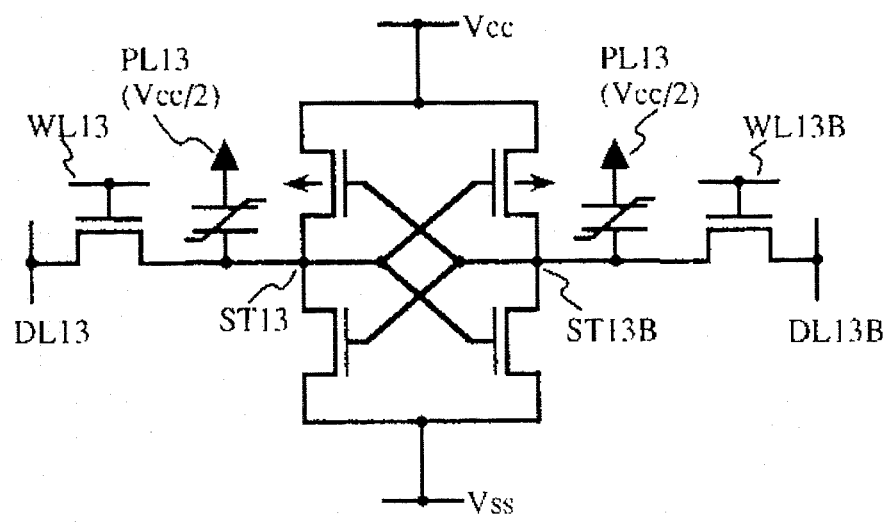
FIG. 27 is a diagram showing the ferroelectric memory cell in an embodiment of the invention.

FIG. 27 is a circuit diagram showing a configuration of a ferroelectric memory cell in the fourth embodiment of the present invention. In the present embodiment, the ferroelectric memory cell is configured the configuration of which is similar to that of the static random access memories (SRAMs).

In the present embodiment, to the complementary storage nodes ST13 and ST13B which are constructed by a flip-flop circuit, the ferroelectric capacitors are respectively connected. The plate voltage of each ferroelectric capacitor is Vcc/2 which is about half the power supply voltage.

According to the present embodiment, when reading out the volatile information in the form of the voltages of the storage nodes ST13 and ST13B, the polarization of each ferroelectric capacitor is not switched. When rewriting the volatile information, the polarization state is also simultaneously switched. Therefore, the volatile information always coincides with the nonvolatile information in the form of the polarization state of each ferroelectric capacitor. Therefore, there is provided the effect that even if the power source is turned off at any time, the information can be left in the ferroelectric memory cell. In addition, since the polarization switch is limited to only the time when rewriting the information, i.e., is kept to a minimum, it is possible to suppress the fatigue of the ferroelectric film and thus it is possible to obtain the high reliable ferroelectric memory.

As set forth hereinabove, according to the present invention, the high reliable and high speed ferroelectric memory having the high degree of integration is provided.

What is claimed is:

1. A ferroelectric memory comprising:

a plurality of memory cells, each memory cell including a capacitor having a ferroelectric material as a dielectric film, and including a field effect transistor;

a plurality of data lines, each data line being coupled to a source or a drain of the field effect transistor of a corresponding memory cell of said plurality of memory cells;

a plurality of word lines, each word line being coupled to a gate of the field effect transistor of a corresponding memory cell of said plurality of memory cells;

means for supplying stored voltages, indicative of information, and operative to apply a first operating voltage or a second operating voltage to a storage electrode of the capacitor of each memory cell of said plurality of memory cells through source-drain paths of the field effect transistors of the respective memory cells;

means for supplying an intermediate voltage operative to apply a third operating voltage, of a voltage level between the voltage levels of said first and second operating voltages, to a plate electrode of the capacitor of a corresponding memory cell of said plurality of memory cells;

first detection means for detecting when the power supply voltage supplied to said ferroelectric memory reaches a level equal to or higher than a fixed value;

precharge means responsive to a signal specifying a read operation of a selected one of said memory cells, for precharging the data line used for the read operation to a precharge electric potential of either a fourth operating voltage, having a voltage level between the voltage levels of said first and second operating voltages, or a fifth operating voltage different from said fourth operating voltage, said precharge means being responsive to the stored information in the selected memory cell being read out for the first time after said first detection means detects a first state, for precharging the data line connected to said selected memory cell to the fifth operating voltage; and switching means for generating a switching signal to switch the precharge electric potential of the data line connected to said selected memory cell to either the fourth operating voltage or the fifth operating voltage and responsive to the start of the supply of the power supply voltage to said ferroelectric memory for setting the switching signal to a second state to designate the precharge to the fifth operating voltage, and thereafter setting the switching signal to a third state, different from the second state, to designate the precharge to the fourth operating voltage.

2. A ferroelectric memory according to claim 1, further comprising means for setting the third and fourth operating voltages to substantially the same electric potential.

3. A ferroelectric memory according to claim 1, further comprising:

second detection means for detecting when the power source voltage supplied to said ferroelectric memory has dropped to a level equal to or lower than a fixed value; and control means responsive to said second detection means detecting a fourth state, for applying the first operating voltage to said plurality of word lines and then applying the first operating voltage to the plate of the capacitor of each memory cell of said plurality of memory cells.

4. A ferroelectric memory according to claim 1, further comprising:

control means responsive to said first detection means detecting the first state, for causing said intermediate voltage supplying means to apply the third operating voltage to the plate electrode of the capacitor of each memory cell, with said control means continuing to apply the first operating voltage to said plurality of word lines until the third operating voltage is applied to said plate electrodes.

5. A ferroelectric memory according to 1, further comprising:

second detection means for detecting when the power supply voltage supplied to said ferroelectric memory has dropped to a level equal to or lower than a fixed value; and control means responsive to said second detection means detecting a fourth state, for applying the first operating voltage to said plurality of word lines and then applying the first operating voltage to the plate of the capacitor of each memory cell of said plurality of memory cells, and responsive to said first detection means detecting the first state, for causing said intermediate voltage supplying means to apply the third operating voltage to the plate electrode of the capacitor of each memory cell, with said control means continuing to apply the first operating voltage to said plurality of word lines until the third operating voltage is applied to said plate electrodes.

6. A ferroelectric memory according to claim 8, further comprising:

control means for internally executing a recall operation to convert nonvolatile information as a polarization state of a film made of a ferroelectric material into volatile information as an electric potential at one node of the capacitor of said selected memory cell for a period of time during which the switching signal is in the second state with respect to said selected memory cell.

7. A ferroelectric memory according to claim 1, further comprising:

control means responsive to an input signal from an external source, for executing a recall operation to convert nonvolatile information as a polarization state of a film made of a ferroelectric material into volatile information as an electric potential at one node of the capacitor of said selected memory cell for a period of time during which the switching signal is in the second state with respect to at least a part of said memory cells.

8. A ferroelectric memory according to claim 6, wherein:

said switching means is responsive to a signal from an internal time after the elapse of a predetermined time following the start of the supply of the power supply voltage.

9. A ferroelectric memory according to claim 6 or 7 wherein:

said switching means is responsive to detection of an internal counter reaching a predetermined state.

10. A ferroelectric memory according to claim 9 wherein:

said switching means is further responsive to detecting a most significant carry of said internal counter.

11. A ferroelectric memory according to claim 7, wherein:

said control means is responsive to the input signal only when the switching signal is in the second state for executing the recall operation, and is responsive to the input signal when the switching signal is in the third state for performing a refresh operation of an ordinary DRAM.

12. A ferroelectric memory according to claim 1, further comprising:

control means responsive to the switching signal being in the second state for activating a dummy cell, and responsive to the switching signal being in the third state for deactivating the dummy cell.

13. A ferroelectric memory according to claims 1, further comprising:

a plurality of plate lines, each plate line being coupled to a corresponding group of memory cells of said plurality of memory cells, wherein each group of memory cells is coupled to a corresponding word line of said plurality of word lines.

14. A ferroelectric memory comprising:

a plurality of memory cells, each memory cell including a capacitor having a ferroelectric material as a dielectric film, and including a field effect transistor;

a plurality of data lines, each data line being coupled to a source or a drain of the field effect transistor of a corresponding memory cell of said plurality of memory cells;

a plurality of word lines, each word line being coupled to a gate of the field effect transistor of a corresponding memory cell of said plurality of memory cells;

means for supplying stored voltages, indicative of information, and operative to apply a first operating voltage or a second operating voltage to a storage electrode of the capacitor of each memory cell of said plurality of memory cells through source-drain paths of the field effect transistors of the respective memory cells;

means for applying either a third operating voltage of a voltage level between the voltage levels of the first and second operating voltages, or a fourth operating voltage of a voltage level equal to or lower than the voltage level of the first operating voltage or equal to or higher than the voltage level of the second operating voltage, to a plate electrode of the capacitor of each memory cell of said plurality of memory cells;

precharge means responsive to a signal specifying a read operation, for precharging a selected data line of said plurality of data lines to a fifth operating voltage, of a voltage level between the voltage levels of the first and second operating voltages; and control means for ordinarily applying the fourth operating voltage to said plate electrode and for applying the third operating voltage to said plate electrode at predetermined intervals of time.

15. A ferroelectric memory comprising:

a plurality of memory cells, each memory cell including a capacitor having a ferroelectric material as a dielectric film, and including a field effect transistor;

a plurality of data lines, each data line being coupled to a source or a drain of the field effect transistor of a corresponding memory cell of said plurality of memory cells;

a plurality of word lines, each word line being coupled to a gate of the field effect transistor of a corresponding memory cell of said plurality of memory cells;

means for applying stored voltages, indicative of information, and operative to apply a first operating voltage or a second operating voltage to a storage electrode of the capacitor of each memory cell of said plurality of memory cells through source-drain paths of the field effect transistors of the respective memory cells; and control means for controlling said memory cells to form a one-bit storage unit from one of said memory cells to store one bit of information as an electrical voltage at a node of the capacitor of said one of said memory cells, and responsive to a reduction in power supply voltage to form a one-bit storage unit from two of said memory cells to store one bit of information as a combination of polarization states of the ferroelectric material of the capacitors of said two of said memory cells, said two of said memory cells being respectively connected to two of said word lines.

16. A ferroelectric memory comprising:

a plurality of memory cells, each memory cell including a capacitor having a ferroelectric material as a dielectric film, and including a field effect transistor;

a plurality of data lines, each data line being coupled to a source or a drain of the field effect transistor of a corresponding memory cell of said plurality of memory cells;

a plurality of word lines, each word line being coupled to a gate of the field effect transistor of a corresponding memory cell of said plurality of memory cells;

a sense amplifier for supplying stored voltages, indicative of information, and operative to apply a first operating voltage or a second operating voltage to a storage electrode of the capacitor of each memory cell of said plurality of memory cells through source-drain paths of the field effect transistors of the respective memory cells;

an electronic switching circuit for supplying an intermediate voltage operative to apply a third operating voltage, of a voltage level between the voltage levels of said first and second operating voltages, to a plate electrode of the capacitor of a corresponding memory cell of said plurality of memory cells;

a first power supply detection circuit for detecting when the power supply voltage supplied to said ferroelectric memory reaches a level equal to or higher than a fixed value;

a precharge circuit responsive to a signal specifying a read operation of a selected one of said memory cells, for precharging the data line used for the read operation to a precharge electric potential of either a fourth operating voltage, having a voltage level between the voltage levels of said first and second operating voltages, or a fifth operating voltage different from said fourth operating voltage, said precharge circuit being responsive to the stored information in the selected memory cell being read out for the first time after said first power supply detection circuit detects a first state, for precharging the data line connected to said selected memory cell to the fifth operating potential; and a second switching circuit for generating a switching signal to switch the precharge electric potential of the data line connected to said selected memory cell to either the fourth operating voltage or the fifth operating voltage and responsive to the start of the supply of the power supply voltage to said ferroelectric memory for setting the switching signal to a second state to designate the precharge to the fifth operating voltage, and thereafter setting the switching signal to a third state, different from the second state, to designate the precharge to the fourth operating voltage.

17. A ferroelectric memory according to claim 16, further comprising a voltage control circuit for setting the third and fourth operating voltages to substantially the same electric potential.

18. A ferroelectric memory according to claim 16, further comprising:

a second power supply detection circuit for detecting when the power source voltage supplied to said ferroelectric memory has dropped to a level equal to or lower than a fixed value; and a third switching circuit responsive to said second power supply detection circuit detecting a fourth state, for applying the first operating voltage to said plurality of word lines and then applying the first operating voltage to the plate of the capacitor of each memory cell of said plurality of memory cells.

19. A ferroelectric memory according to claim 16, further comprising:

a third switching circuit responsive to said first power supply detection circuit detecting the first state, for causing said electronic switching circuit to apply the third operating voltage to the plate electrode of the capacitor of each memory cell, with said third circuit continuing to apply the first operating voltage to said plurality of word lines until the third operating voltage is applied to said plate electrodes.

20. A ferroelectric memory according to 16, further comprising:

a second power supply detection circuit for detecting when the power supply voltage supplied to said ferroelectric memory has dropped to a level equal to or lower than a fixed value; and a third switching circuit responsive to said second power supply detection circuit detecting a fourth state, for applying the first operating voltage to said plurality of word lines and then applying the first operating voltage to the plate of the capacitor of each memory cell of said plurality of memory cells, and responsive to said first power supply detection circuit detecting the first state, for causing said electronic switching circuit to apply the third operating voltage to the plate electrode of the capacitor of each memory cell, with said third circuit continuing to apply the first operating voltage to said plurality of word lines until the third operating voltage is applied to said plate electrodes.

21. A ferroelectric memory according to claim 16, further comprising:

a third switching circuit for internally executing a recall operation to convert nonvolatile information as a polarization state of a film made of a ferroelectric material into volatile information as an electric potential at one node of the capacitor of said selected memory cell for a period of time during which the switching signal is in the second state with respect to said selected memory cell.

22. A ferroelectric memory according to claim 16, further comprising:

a third switching circuit responsive to an input signal from an external source, for executing a recall operation to convert nonvolatile information as a polarization state of a film made of a ferroelectric material into volatile information as an electric potential at one node of the capacitor of said selected memory cell for a period of time during which the switching signal is in the second state with respect to at least a part of said memory cells.

23. A ferroelectric memory according to claim 21, wherein:

said second switching circuit is responsive to a signal from an internal time after the elapse of a predetermined time following the start of the supply of power from the power source.

24. A ferroelectric memory according to claim 21 or 22 wherein:

said second switching circuit is responsive to detection of an internal counter reaching a predetermined state.

25. A ferroelectric memory according to claim 24, wherein:

said second switching circuit is further responsive to detecting a most significant carry of said internal counter.

26. A ferroelectric memory according to claim 22, wherein:

said third switching circuit is responsive to the input signal only when the switching signal is in the second state for executing the recall operation, and is responsive to the input signal when the switching signal is in the third state for performing a refresh operation of an ordinary DRAM.

27. A ferroelectric memory according to claim 16, further comprising:

a third switching circuit responsive to the switching signal being in the second state for activating a dummy cell, and responsive to the switching signal being in the third state for deactivating the dummy cell.

28. A ferroelectric memory according to claim 16, further comprising:

a plurality of plate lines, each plate line being coupled to a corresponding group of memory cells of said plurality of memory cells, wherein each group of memory cells is coupled to a corresponding word line of said plurality of word lines.

29. A ferroelectric memory comprising:

a plurality of memory cells, each memory cell including a capacitor having a ferroelectric material as a dielectric film, and including a field effect transistor;

a plurality of data lines, each data line being coupled to a source or a drain of the field effect transistor of a corresponding memory cell of said plurality of memory cells;

a plurality of word lines, each word line being coupled to a gate of the field effect transistor of a corresponding memory cell of said plurality of memory cells;

a sense amplifier for supplying stored voltages, indicative of information, and operative to apply a first operating voltage or a second operating voltage to a storage electrode of the capacitor of each memory cell of said plurality of memory cells through source-drain paths of the field effect transistors of the respective memory cells;

an electronic switching circuit for applying either a third operating voltage of a voltage level between the voltage levels of the first and second operating voltages, or a fourth operating voltage of a voltage level equal to or lower than the voltage level of the first operating voltage or equal to or higher than the voltage level of the second operating voltage, to a plate electrode of the capacitor of each memory cell of said plurality of memory cells;

a precharge circuit responsive to a signal specifying a read operation, for precharging a selected data line of said plurality of data lines to a fifth operating voltage, of a voltage level between the voltage levels of the first and second operating voltages; and a second switching circuit for ordinarily applying the fourth operating voltage to said plate electrode and for applying the third operating voltage to said plate electrode at predetermined intervals of time.

30. A ferroelectric memory comprising:

a plurality of memory cells, each memory cell including a capacitor having a ferroelectric material as a dielectric film, and including a field effect transistor;

a plurality of data lines, each data line being coupled to a source or a drain of the field effect transistor of a corresponding memory cell of said plurality of memory cells;

a plurality of word lines, each word line being coupled to a gate of the field effect transistor of a corresponding memory cell of said plurality of memory cells;

a sense amplifier for applying stored voltages, indicative of information, and operative to apply a first operating voltage or a second operating voltage to a storage electrode of the capacitor of each memory cell of said plurality of memory cells through source-drain paths of the field effect transistors of the respective memory cells; and a switching circuit for controlling said memory cells to form a one-bit storage unit from one of said memory cells to store one bit of information as an electrical voltage at a node of the capacitor of said one of said memory cells, and responsive to a reduction in power supply voltage to form a one-bit storage unit from two of said memory cells to store one bit of information as a combination of polarization states of the ferroelectric material of the capacitors of said two of said memory cells, said two of said memory cells being respectively connected to two of said word lines.

* * * * *